US011205485B2

(12) United States Patent
Kim et al.

(10) Patent No.: US 11,205,485 B2
(45) Date of Patent: *Dec. 21, 2021

(54) THREE-DIMENSIONAL NAND FLASH MEMORY DEVICE HAVING IMPROVED DATA RELIABILITY BY VARYING PROGRAM INTERVALS, AND METHOD OF OPERATING THE SAME

(71) Applicant: SAMSUNG ELECTRONICS CO., LTD., Suwon-si (KR)

(72) Inventors: Seung-Bum Kim, Hwaseong-si (KR); Min-Su Kim, Hwaseong-si (KR); Deok-Woo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/935,598

(22) Filed: Jul. 22, 2020

(65) Prior Publication Data
US 2020/0350020 A1 Nov. 5, 2020

Related U.S. Application Data

(63) Continuation of application No. 16/299,684, filed on Mar. 12, 2019, now Pat. No. 11,049,577.

(30) Foreign Application Priority Data

Mar. 30, 2018 (KR) .................. 10-2018-0037763

(51) Int. Cl.
*G11C 16/10* (2006.01)
*G11C 16/04* (2006.01)
(Continued)

(52) U.S. Cl.
CPC .......... *G11C 16/10* (2013.01); *G11C 16/0483* (2013.01); *G11C 16/08* (2013.01);
(Continued)

(58) Field of Classification Search
None
See application file for complete search history.

(56) References Cited

U.S. PATENT DOCUMENTS 8,174,905 B2   5/2012   Shalvi et al.
8,437,185 B2   5/2013   Shalvi et al.
(Continued)

FOREIGN PATENT DOCUMENTS

KR       10-0764750       10/2007
KR   10-2013-0063191        6/2013
(Continued)

*Primary Examiner* — J. H. Hur
(74) *Attorney, Agent, or Firm* — Volentine, Whitt & Francos, PLLC

(57) ABSTRACT

A memory device includes: a memory cell region; a peripheral circuit region; a memory cell array; a control logic circuit; and a row decoder. The row decoder is configured to activate string selection lines based on control of the control logic circuit. A program interval is formed between a first program operation and a second program operation. The control logic circuit includes a reprogram controller configured to control the row decoder so that a program interval differs in the memory cells connected to different string selection lines among the memory cells connected to a first wordline.

20 Claims, 20 Drawing Sheets

(51) Int. Cl.

| | | |
|---|---|---|
| *G11C 16/08* | (2006.01) | |
| *G11C 16/34* | (2006.01) | |
| *H01L 25/065* | (2006.01) | |
| *H01L 25/18* | (2006.01) | |
| *H01L 23/00* | (2006.01) | |
| *H01L 27/11556* | (2017.01) | |
| *H01L 27/11582* | (2017.01) | |

(52) U.S. Cl.
 CPC ............ *G11C 16/349* (2013.01); *H01L 24/05* (2013.01); *H01L 24/08* (2013.01); *H01L 25/0657* (2013.01); *H01L 25/18* (2013.01); *H01L 27/11556* (2013.01); *H01L 27/11582* (2013.01); *H01L 2224/05147* (2013.01); *H01L 2224/08145* (2013.01); *H01L 2924/1431* (2013.01); *H01L 2924/14511* (2013.01)

(56) References Cited

U.S. PATENT DOCUMENTS

| | | | |
|---|---|---|---|
| 9,767,910 B1 | 9/2017 | Bushmaq et al. | |
| 10,115,681 B1* | 10/2018 | Ariyoshi | ........... H01L 27/11524 |
| 10,199,326 B1* | 2/2019 | Ohsaki | ................. H01L 23/481 |
| 10,354,980 B1* | 7/2019 | Mushiga | ........... H01L 27/11575 |
| 10,354,987 B1* | 7/2019 | Mushiga | ........... H01L 21/76898 |
| 10,665,580 B1* | 5/2020 | Hosoda | ................... G11C 16/26 |
| 10,665,581 B1* | 5/2020 | Zhou | ....................... H01L 24/73 |
| 10,665,607 B1* | 5/2020 | Sugiura | ............. H01L 27/10844 |
| 2008/0089129 A1 | 4/2008 | Lee | |
| 2010/0090286 A1* | 4/2010 | Lee | ........................ H01L 29/792 |
| | | | 257/368 |
| 2010/0322000 A1 | 12/2010 | Shim et al. | |
| 2012/0213005 A1* | 8/2012 | Lee | ....................... G11C 16/349 |
| | | | 365/185.11 |
| 2013/0145234 A1 | 6/2013 | Yoon et al. | |
| 2013/0275658 A1* | 10/2013 | Han | ................... G11C 16/0483 |
| | | | 711/103 |
| 2013/0326312 A1 | 12/2013 | Lee et al. | |
| 2015/0117100 A1 | 4/2015 | Park et al. | |
| 2017/0249995 A1 | 8/2017 | Park et al. | |
| 2018/0138192 A1* | 5/2018 | Shin | ................... H01L 27/11526 |
| 2020/0185039 A1* | 6/2020 | Chibvongodze | .... G11C 11/5642 |

FOREIGN PATENT DOCUMENTS

| | | |
|---|---|---|
| KR | 10-2013-0135621 | 12/2013 |
| KR | 10-2015-0047394 | 5/2015 |
| KR | 10-1635504 | 6/2016 |
| KR | 10-2017-0101000 | 9/2017 |

* cited by examiner

FIG. 11B

| | SSL[0] | | SSL[1] | | SSL[2] | | SSL[3] | |
|---|---|---|---|---|---|---|---|---|
| | 1st PGM | 2nd PGM | 1st PGM | 2nd PGM | 1st PGM | 2nd PGM | 1st PGM | 2nd PGM |
| WL[M] | 1 | 12 | 2 | 11 | 3 | 10 | 4 | 9 |
| WL[M-1] | 5 | 20 | 6 | 19 | 7 | 18 | 8 | 17 |
| WL[M-2] | 13 | | 14 | | 15 | | 16 | |
| ⋮ | | | | | | | | |

FIG. 12B

| | SSL[1] | | | SSL[2] | | | SSL[3] | | | SSL[4] | | |
|---|---|---|---|---|---|---|---|---|---|---|---|---|
| | 1st PGM | 2nd PGM | 3rd PGM | 1st PGM | 2nd PGM | 3rd PGM | 1st PGM | 2nd PGM | 3rd PGM | 1st PGM | 2nd PGM | 3rd PGM |
| ⋮ | | | | | | | | | | | | |
| WL[3] | 13 | | | 14 | | | 15 | | | 16 | | |
| WL[2] | 5 | 17 | | 6 | 18 | | 7 | 19 | | 8 | 20 | |
| WL[1] | 1 | 9 | 24 | 2 | 10 | 23 | 3 | 11 | 22 | 4 | 12 | 21 |

FIG. 13B

|  | SSL[1] | | SSL[2] | | SSL[3] | | SSL[4] | |
|---|---|---|---|---|---|---|---|---|
|  | 1st PGM | 2nd PGM | 1st PGM | 2nd PGM | 1st PGM | 2nd PGM | 1st PGM | 2nd PGM |
| ⋮ | | | | | | | | |
| WL[3] | 10 | | 12 | | 14 | | 16 | |
| WL[2] | 2 | 24 | 4 | 22 | 6 | 20 | 8 | 18 |
| WL[1] | 1 | 15 | 3 | 13 | 5 | 11 | 7 | 9 | ic
THREE-DIMENSIONAL NAND FLASH MEMORY DEVICE HAVING IMPROVED DATA RELIABILITY BY VARYING PROGRAM INTERVALS, AND METHOD OF OPERATING THE SAME

CROSS-REFERENCE TO RELATED APPLICATION

This is a CIP of U.S. patent application Ser. No. 16/299,684, filed Mar. 13, 2019, now U.S. Pat. No. 11,049,577 issued on Jun. 29, 2021, which claims the benefit of priority to Korean Patent Application No. 10-2018-0037763, filed on Mar. 30, 2018 in the Korean Intellectual Property Office, the disclosure of which is incorporated herein in its entirety by reference.

BACKGROUND

1. Technical Field

The present disclosure relates to a memory device. More particularly, the present disclosure relates to a memory device having improved data reliability and a method of operating the same.

2. Description of the Related Art

Non-volatile memory devices are semiconductor memory devices that include multiple memory cells in which pieces of data are stored in a non-volatile manner. Flash memory systems are examples of non-volatile memory devices that have been widely used in universal serial bus (USB) drives, digital cameras, mobile phones, smartphones, tablets, personal computers (PCs), memory cards, and solid-state drives (SSDs). In memory systems such as non-volatile memory devices, a significant demand exists to enable large-capacity storage and to improve the reliability of programmed data.

SUMMARY

According to aspects of the present disclosure, a memory device and a method of operating the same provide improved data reliability, whereby the order of program operations to be performed may be controlled according to string selection lines.

According to an aspect of the present disclosure, a memory cell region includes a first metal pad. A peripheral circuit region includes a second metal pad and vertically connected to the memory cell region by the first metal pad and the second metal pad. A memory cell array in the memory cell region includes multiple string selection lines, multiple cell strings respectively connected to the string selection lines and including multiple memory cells, and multiple wordlines connected to the memory cells. A control logic circuit in the peripheral circuit region is configured to control multiple data program steps with respect to the memory cells. A row decoder in the peripheral circuit region is configured to activate the string selection lines based on control of the control logic circuit. The data program steps include a first program operation and a second program operation between which a program interval is formed. The control logic circuit includes a reprogram controller configured to control the row decoder so that a program interval differs in the memory cells connected different string selection lines among the memory cells connected to a first wordline.

According to another aspect of the present disclosure, the memory device comprising a memory cell region including a first metal pad and a peripheral circuit region including a second metal pad and vertically connected to the memory cell region by the first metal pad and the second metal pad. A memory cell array in the memory cell region includes multiple string selection lines, multiple cell strings respectively connected to the string selection lines and including multiple memory cells, and multiple wordlines connected to the memory cells. A method of operating a memory device that includes the memory cell array includes: performing a first program operation on the memory cells connected to a first wordline among the wordlines; performing the first program operation on the memory cells connected to a second wordline among the wordlines; and performing a second program operation on the memory cells connected to the first wordline, A first interval between the first program operation and the second program operation differs in the memory cells included in the cell strings connected to different string selection lines among the memory cells connected to the first wordline.

According to another aspect of the present disclosure, the memory device comprising a memory cell region including a first metal pad and a peripheral circuit region including a second metal pad and vertically connected to the memory cell region by the first metal pad and the second metal pad. A memory cell array in the memory cell region includes multiple string selection lines, multiple cell strings respectively connected to the string selection lines and including multiple memory cells, and multiple wordlines connected to the memory cells. A method of operating a memory device that includes the memory cell array includes: performing a first program operation on the memory cells included in the cell strings connected to a first string selection line among the memory cells connected to a first wordline; performing the first program operation on the memory cells included in the cell strings connected to string selection lines other than the first string selection line among the memory cells connected to the first wordline; performing the first program operation on the memory cells connected to a second wordline; performing a second program operation on the memory cells included in the cell strings connected to string selection lines other than the first string selection line among the memory cells connected to the first wordline; and performing the second program operation on the memory cells included in the cell strings connected to the first string selection line among the memory cells connected to the first wordline.

BRIEF DESCRIPTION OF THE DRAWINGS

Embodiments of the present disclosure will be more clearly understood from the following detailed description taken in conjunction with the accompanying drawings in which:

FIGS. 11A and 11B are illustrations for explaining program operations according to an example embodiment of the present disclosure;

FIGS. 12A and 12B are illustrations for explaining program operations according to another example embodiment of the present disclosure;

FIGS. 13A and 13B are illustrations for explaining program operations according to another example embodiment of the present disclosure;

DETAILED DESCRIPTION OF THE EMBODIMENTS

Hereinafter, example embodiments of the present disclosure will be described in detail with reference to the accompanying drawings.

Figure 1:
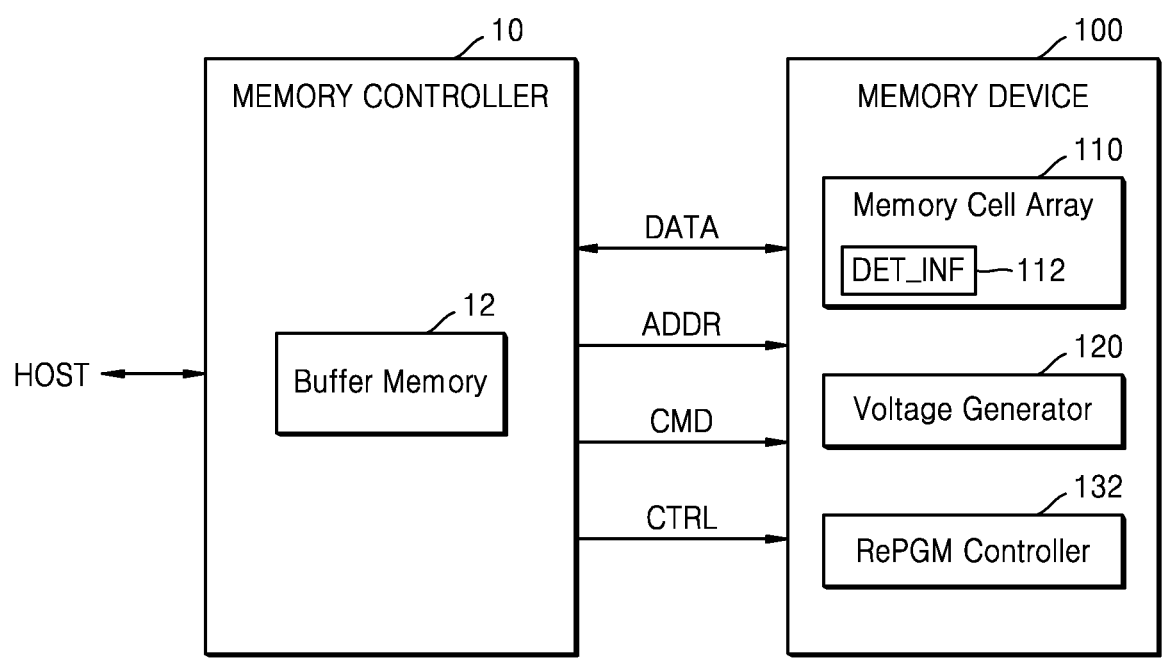
FIG. 1 illustrates a block diagram of a memory system according to an example embodiment of the present disclosure.

FIG. 1 illustrates a block diagram of a memory system according to an example embodiment of the present disclosure. Referring to FIG. 1, a memory system 1 may include a memory controller 10 and a memory device 100. The memory controller 10 may include a buffer memory 12, and the memory device 100 may include a memory cell array 110, a voltage generator 120, and a reprogram controller 132.

In FIGs. herein including FIG. 1, circuitry may be shown as, for example, a "controller", a "device", "logic", a "circuit", a "generator", a "decoder", a "block", and a "unit". As is traditional in the field of the inventive concept(s) described herein, examples may be described and illustrated in terms of blocks which carry out a described function or functions. These blocks, which may be referred to herein as a controller, a device, logic, a circuit, a generator, a decoder, a block, and a unit or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the examples may be physically separated into two or more interacting and discrete blocks without departing from the scope of the inventive concepts. Likewise, the blocks of the examples may be physically combined into more complex blocks without departing from the scope of the inventive concepts.

In some embodiments, the memory system 1 may be implemented with an internal memory embedded in an electronic device and may be universal flash storage (UFS) memory devices, embedded multi-media cards (eMMCs), or solid-state drives (SSDs), for example. In some embodiments, the memory system 1 may be implemented with an external memory that is detachably attached to the electronic device and may be UFS memory cards, compact flash (CF) memories, secure digital (SD) memories, micro-SD memories, mini-SD memories, extreme digital (xD) memories, or memory sticks.

The memory controller 10 may control the memory device 100 so as to read data stored in the memory device 100 or to program the data into the memory device 100 in response to a write/read request from a host HOST. In detail, the memory controller 10 may provide an address ADDR, a command CMD, and a control signal CTRL to the memory device 100, thereby controlling programming, read, and erase operations to be performed on the memory device 100. Also, data DATA to be programmed and read data DATA may be received from the memory device 100 and may be transmitted to the memory controller 10.

The buffer memory 12 provided in the memory controller 10 may temporarily store data transmitted from the host HOST and may store data read from the memory device 100. For example, data transmitted from the host HOST that is data to be programmed into the memory cell array 110, may be written into the memory cell array 110 via multiple data program steps.

In an example embodiment, a first program operation may be performed on memory cells connected to a first wordline of the memory cell array 110 based on first data stored in the buffer memory 12. Subsequently, the first program operation may be performed on the memory cells connected to a second wordline of the memory cell array 110 based on second data stored in the buffer memory 12. Then, a second program operation may be performed on the memory cells connected to the first wordline based on the first data. For example, the first program operation may be referred to as a pre-program operation. Also, the second program operation may also be referred to as a reprogram operation with respect to the first program operation.

In an example embodiment, the second program operation may be performed in a different order from an order of the first program operation. The reprogram controller 132 may control the voltage generator 120 for generating various types of voltage signals used in memory operations such as program and erase operations, and the like, thereby adjusting the order of the second program operation. A detailed description thereof will be described later.

For example, the memory device 100 may include a single memory chip. In another example, the memory device 100 may also include multiple memory chips. One memory chip may include a single die or multiple dies. One die may include a single plane or multiple planes. One plane may include multiple memory blocks, and each of the memory blocks may include multiple pages, and each of the pages may include multiple sectors.

The memory cell array 110 may include multiple memory cells. For example, the memory cells may be flash memory cells. The memory cell array 110 may include multiple cell strings (or NAND strings) connected to points where multiple string selection lines and multiple bitlines cross one another. Each of the cell strings may include multiple memory cells. For example, each of the cell strings may be implemented to extend in a direction perpendicular to a semiconductor substrate. Thus, each cell string may include multiple memory cells that are arranged perpendicular to the semiconductor substrate. The memory cells included in the cell strings may be connected to multiple wordlines. That is, different memory cells in a single cell string may be connected to different wordlines, and this is shown for example by cell string NS11 to cell string NS33 and word line WL1 to word line WL8 in FIG. 5.

In an example embodiment, deterioration information 112 may be stored in the memory cell array 110. The deterioration information 112 may include deterioration information about the string selection lines. In detail, the deterioration information 112 may include information about a degree of deterioration of the memory cells included in the cell strings connected to the string selection lines. For example, the deterioration information 112 may include information about string selection lines having poor deterioration endurance and/or string selection lines having excellent deterioration endurance. The deterioration information 112 may be ranked or categorized, such as to reflect when string selection lines are deteriorated or not, or to reflect when string selection lines have the highest deterioration endurance or the lowest deterioration endurance of two or more categories of deterioration endurance. The deterioration information may reflect the amount of usage of the memory cells included in the cell strings connected to the string selection line. The amount of usage may be a duration of usage, a number of uses, or other types of information that reflect how much a memory cell may have deteriorated from a starting point in time.

In an example, the deterioration information 112 may be information statistically predicted by a test before mass-production of the memory device 100. In the present embodiment, pieces of the deterioration information 112 are stored in the memory cell array 110. However, this is just an example, and embodiments of the present disclosure are not limited thereto. That is, an additional memory for storing the deterioration information 112 may also or alternatively be provided in the memory device 100.

In an example embodiment, one string selection line among the string selection lines may be set as a string selection line having poor deterioration endurance such as the lowest deterioration endurance or category of deterioration endurance among the string selection lines. The string selection line having poor deterioration endurance may be a string selection line in which distribution of cells of memory cells included in the cell strings connected to the corresponding string selection line is predicted to be deteriorated at a certain criterion or more. Distribution may mean distribution of threshold voltages of the memory cells. For example, the prediction may be statistically performed by a test before mass-production of the memory device 100. Deterioration of the string selection line may be based on various causes, and the string selection line having poor deterioration endurance may be predicted by various types of test methods.

In an example embodiment, an interval between the first program operation and the second program operation in the memory cells connected to the first wordline among the wordlines may be changed according to a string selection line to which each memory cell is connected. For example, the interval may mean a temporal interval between the first program operation and the second program operation. Hereinafter, in the current specification, the interval between the first program operation and the second program operation on an arbitrary memory cell will be referred to as a 'program interval'.

In an example, when the first string selection line is predicted as a deterioration string selection line (i.e., having poor deterioration endurance), a program interval in the memory cells included in the cell strings connected to the first string selection line among the memory cells connected to the first wordline may be a first interval. The first interval may be longer than a program interval in the memory cells included in the cell strings connected to string selection lines other than the first string selection line among the memory cells connected to the first wordline. In other words, the order of the first program operation and the order of the second program operation on the memory cells connected to one wordline may be changed. The order of the program operations may vary according to string selection lines, such as by which string selection line is connected to which cell string. Since the cell strings include a set of memory cells, the order of the program operation on the memory cells included in the cell strings may vary by which string selection line is connected to which cell string.

In an example embodiment, one string selection line among the string selection lines may also be set as a string selection line having excellent deterioration endurance, where excellent deterioration endurance may be the highest deterioration endurance of two or more categories of deterioration endurance. For example, the string selection line having excellent deterioration endurance may be statistically predicted by a test before mass-production of the memory device 100.

In an example, when the second string selection line is predicted as a string selection line having excellent deterioration endurance, a program interval in the memory cells included in the cell strings connected to the second string selection line among the memory cells connected to the first wordline may be a second interval. The second interval may be shorter than a program interval in the memory cells included in the cell strings connected to string selection lines other than the second string selection line among the memory cells connected to the first wordline.

In an example embodiment of the present disclosure, the order of the first program operation and the order of the second program operation may be adaptively controlled according to the string selection line. Thus, a comparatively long program interval is allocated to the string selection line having poor deterioration endurance such that the stability and reliability of data may be further improved.

Figure 2:
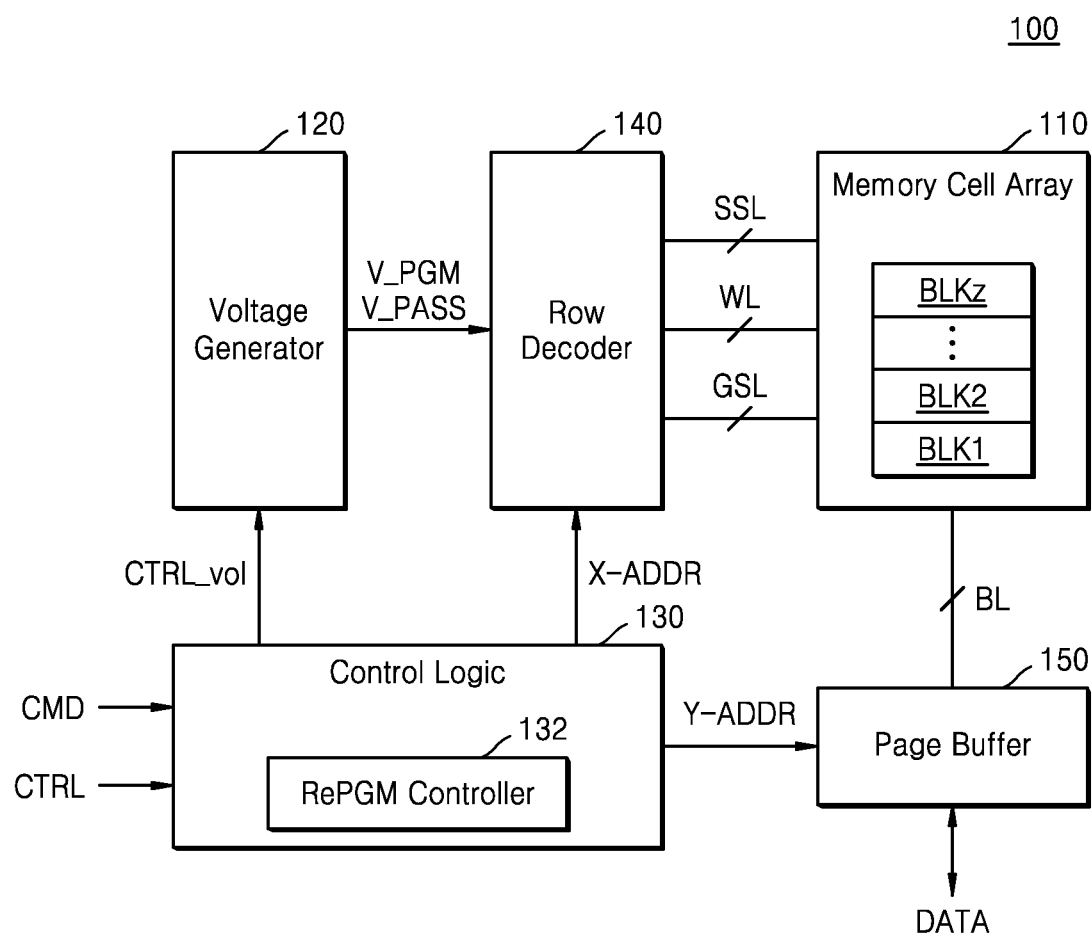
FIG. 2 illustrates a block diagram of a memory device according to an example embodiment of the present disclosure.

FIG. 2 illustrates a block diagram of a memory device according to an example embodiment of the present disclosure. For example, FIG. 2 may illustrate an implementation example of the memory device 100 of FIG. 1.

Referring to FIG. 2, the memory device 100 may include a memory cell array 110, a voltage generator 120, a control logic 130 (e.g., a control logic circuit), a row decoder 140, and a page buffer 150. Although not shown in FIG. 2, the memory device 100 may further include other various components related to a memory operation, such as a data input/output circuit or an input/output interface.

The memory cell array 110 may include multiple memory cells and may be connected to wordlines WL, string selection lines SSL, ground select lines GSL, and bitlines BL. The memory cell array 110 may be connected to the row decoder 140 via the wordlines WL, the string selection lines SSL, and the ground select lines GSL and may be connected to the page buffer 150 via the bitlines BL.

For example, the memory cells included in the memory cell array 110 may be non-volatile memory cells for retaining stored data even though power supplied to the memory cells is cut off. In detail, when the memory cells are non-volatile memory cells, the memory device 100 may be electrically erasable programmable read-only memory (EEPROM), a flash memory, phase change random-access memory (PRAM), resistance random-access memory (RRAM), nano floating gate memory (NFGM), polymer random-access memory (PoRAM), magnetic random-access memory (MRAM), or ferroelectric random-access memory (FRAM). Hereinafter, embodiments of the present disclosure will be described in the context of when the memory cells are NAND flash memory cells. However, embodiments of the present disclosure are not limited thereto.

The memory cell array 110 may include multiple memory blocks BLK1 to BLKZ. Each of the memory blocks BLK1 to BLKZ may have a planar structure or a three-dimensional (3D) structure. The memory cell array 110 may include at least one of a single level cell (SLC) block including single level cells (SLCs), a multi-level cell (MLC) block including MLCs, a triple level cell (TLC) block including TLCs, and a quad level cell (QLC) block including QLCs. For example, some of the memory blocks BLK1 to BLKz may be an SLC block, and the other memory blocks may be MLC blocks, TLC blocks, or QLC blocks.

The voltage generator 120 may generate a variety of voltages used in the memory device 100. In an example, the voltage generator 120 may generate a program voltage V_PGM provided to a selected wordline for a program operation and a pass voltage V_PASS provided to an unselected wordline. Also, although not shown in FIG. 2, the voltage generator 120 may further generate a string select voltage and a ground select voltage (or more, not shown) provided to string selection lines SSL and ground select lines GSL.

The control logic 130 (control logic circuit) may output a variety of internal control signals for programming data into the memory cell array 110 or reading the data from the memory cell array 110 based on a command CMD, an address ADDR, and a control signal CTRL, which are received from the memory controller 10. For example, the control logic 130 (control logic circuit) may output a voltage control signal CTRL_vol for controlling levels of a variety of voltages generated by the voltage generator 120.

The control logic 130 (control logic circuit) may provide a row address X-ADDR to the row decoder 140 and may provide a column address Y-ADDR to the page buffer 150. The row decoder 140 may select at least one from wordlines of a memory block selected in response to the row address X-ADDR. When a program operation is performed, the row decoder 140 may provide a program voltage V_PGM to wordlines of selected memory cells in response to the row address X-ADDR and may provide a pass voltage V_PASS to wordlines of unselected memory cells. The page buffer 150 may operate as a write driver or a sense amplifier. When the program operation is performed, the page buffer 150 may operate as the write driver and may apply a voltage caused by data DATA to be stored in the memory cell array to the bitlines BL. Meanwhile, when a read operation is performed, the page buffer 150 may operate as the sense amplifier and may detect data DATA stored in the memory cell array 110.

The control logic 130 (control logic circuit) may include a reprogram controller 132. However, embodiments of the present disclosure are not limited thereto. The reprogram controller 132 may be provided outside the control logic 130 (control logic circuit).

The control logic 130 (control logic circuit) and the reprogram controller 132 may control the voltage generator 120, the row decoder 140, and the page buffer 150 so that the data program steps may be performed on the memory cell array 110. For example, the control logic 130 (control logic circuit) and the reprogram controller 132 may control the first program operation and the second program operation on the memory cell array 110. However, this is just an example, and the program steps may include first program operation, second program operation, and third program operation or more. In an example embodiment, the control logic 130 (control logic circuit) and the reprogram controller 132 may control the row decoder 140 based on the deterioration information 112 so that the data program steps may be performed.

The first program operation may be performed on the memory cells connected to the first wordline based on control of the control logic 130 (control logic circuit). In an example embodiment, in the first program operation, a primary coarse distribution may be formed on the memory cells connected to the first wordline. For example, when a coarse distribution is formed, distributions in each program state may overlap other adjacent distributions.

In an example embodiment, the first program operation may be performed on the memory cells included in the cell strings connected to a first string selection line among the memory cells connected to the first wordline. Then, the first program operation may be performed on the memory cells included in the cell strings connected to string selection lines other than the first string selection line. In other words, the first program operation may be performed on the memory cells included in the cell strings connected to the first string selection line among the memory cells connected to the first wordline.

Next, the first program operation may be performed on the memory cells connected to the second wordline based on control of the control logic 130 (control logic circuit), and the second program operation may be performed on the memory cells connected to the first wordline based on control of the reprogram controller 132. For example, the second wordline may be a wordline located adjacent to the first wordline. In the second program operation, a secondary fine distribution may be formed on the memory cells connected to the first wordline in which a primary coarse distribution is formed. For example, when a fine distribution is formed, distributions in each program state may not overlap other adjacent distributions but may form a mutual, predetermined interval between temporally adjacent program operations.

When the first program operation is performed, a pulse voltage at a first level may be applied to wordlines connected to the memory cells to be programmed. Also, when the second program operation is performed, a pulse voltage at a second level may be applied to the wordlines connected to the memory cells to be programmed. In an example embodiment, the second level may be higher than the first level. In another example embodiment, a time when the pulse voltage at the second level is applied to the wordlines connected to the memory cells to be programmed may be longer than a time when the pulse voltage at the first level is applied to the wordlines connected to the memory cells to be programmed.

In an example embodiment, the second program operation may be performed on the memory cells included in the cell strings connected to string selection lines other than the first string selection line among the memory cells connected to the first wordline. Then, the second program operation may be performed on the memory cells included in the cell strings connected to the first string selection line among the memory cells connected to the first wordline. In other words, the second program operation may be performed on the memory cells included in the cell strings connected to the first string selection line among the memory cells connected to the first wordline.

For example, the first string selection line may be a string selection line predicted as a deterioration string selection line (i.e., having poor deterioration endurance). Due to control of the reprogram controller 132 according to an embodiment of the present invention, a program interval in the memory cells connected to the first string selection line may be longer than the program interval in the memory cells connected to other string selection lines. Thus, the deterioration string selection line may have a comparatively long program interval such that the reliability of data may be further improved.

Figure 3A:
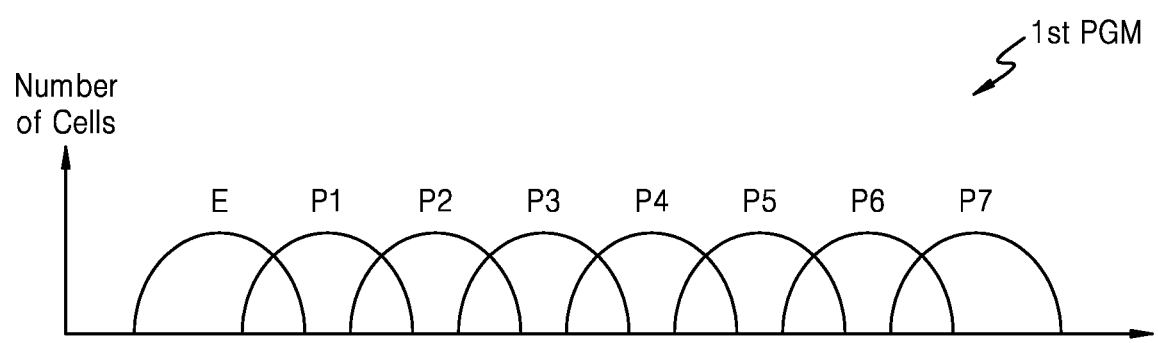
FIGS. 3A and 3B are graphs illustrating distribution of threshold voltages of memory cells to be formed when program operations are performed according to an example embodiment of the present disclosure.
Figure 3B:
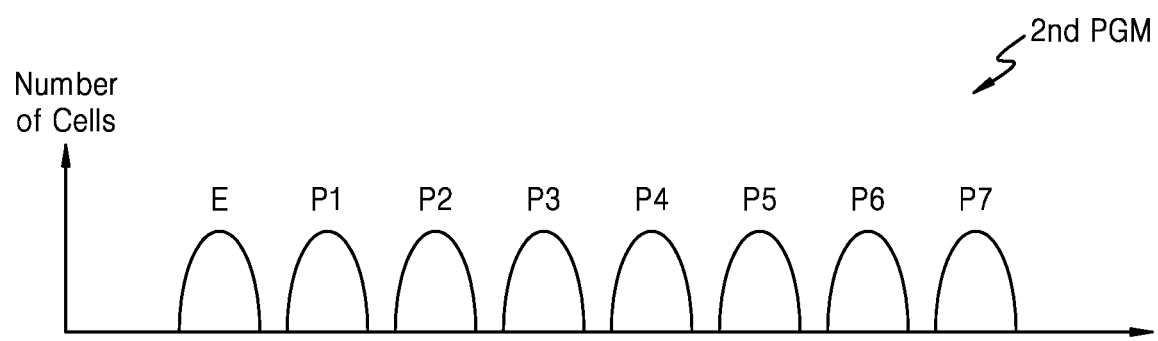

FIGS. 3A and 3B are graphs illustrating distribution of threshold voltages of memory cells to be formed when program operations are performed according to an example embodiment of the present disclosure. In FIGS. 3A and 3B, memory cells are programmed by a triple level cell method (TLC method). However, this is just an example, and embodiments of the present disclosure are not limited thereto.

FIG. 3A illustrates distribution of memory cells connected to the first wordline after the first program operation 1st PGM is performed. As the first program operation 1st PGM is performed, the memory cells may have eight threshold voltage distributions. In an example, the memory cells may include distribution of threshold voltages in first program states P1 through seventh program states P7 together with distribution of threshold voltages in an erase state E. The memory cells, on which the first program operation 1st PGM is performed, may have a coarse threshold voltage distribution. For example, distributions in each program state may overlap other adjacent distributions. Although not shown, as the first program operation 1st PGM is performed on the first wordline, an overlapping region between threshold voltage distributions of the memory cells connected to the first wordline may be further increased.

FIG. 3B illustrates distribution of threshold voltages of the memory cells connected to the first wordline after the second program operation 2nd PGM is performed. As the second program operation 2nd PGM is performed, the memory cells may have independent final threshold voltage distributions having no overlapping region. In an example embodiment of the present disclosure, a program interval in the memory cells connected to the string selection line having poor deterioration endurance may be longer than a program interval in the memory cells connected to other string selection lines. Thus, the memory cells form further-improved threshold voltage distribution, and the reliability of data stored in the memory device 100 may be improved.

In the current embodiment, the program operation is performed in two steps including the first program operation 1st PGM and the second program operation 2nd PGM. However, this is just an example, and embodiments of the present disclosure are not limited thereto. For example, the program operation may also be performed in three steps or more. Also, when a program operation is performed on multi-bit memory cells, such as MLCs or TLCs, the stepwise program operation may also be performed in units of bit.

Figure 4:
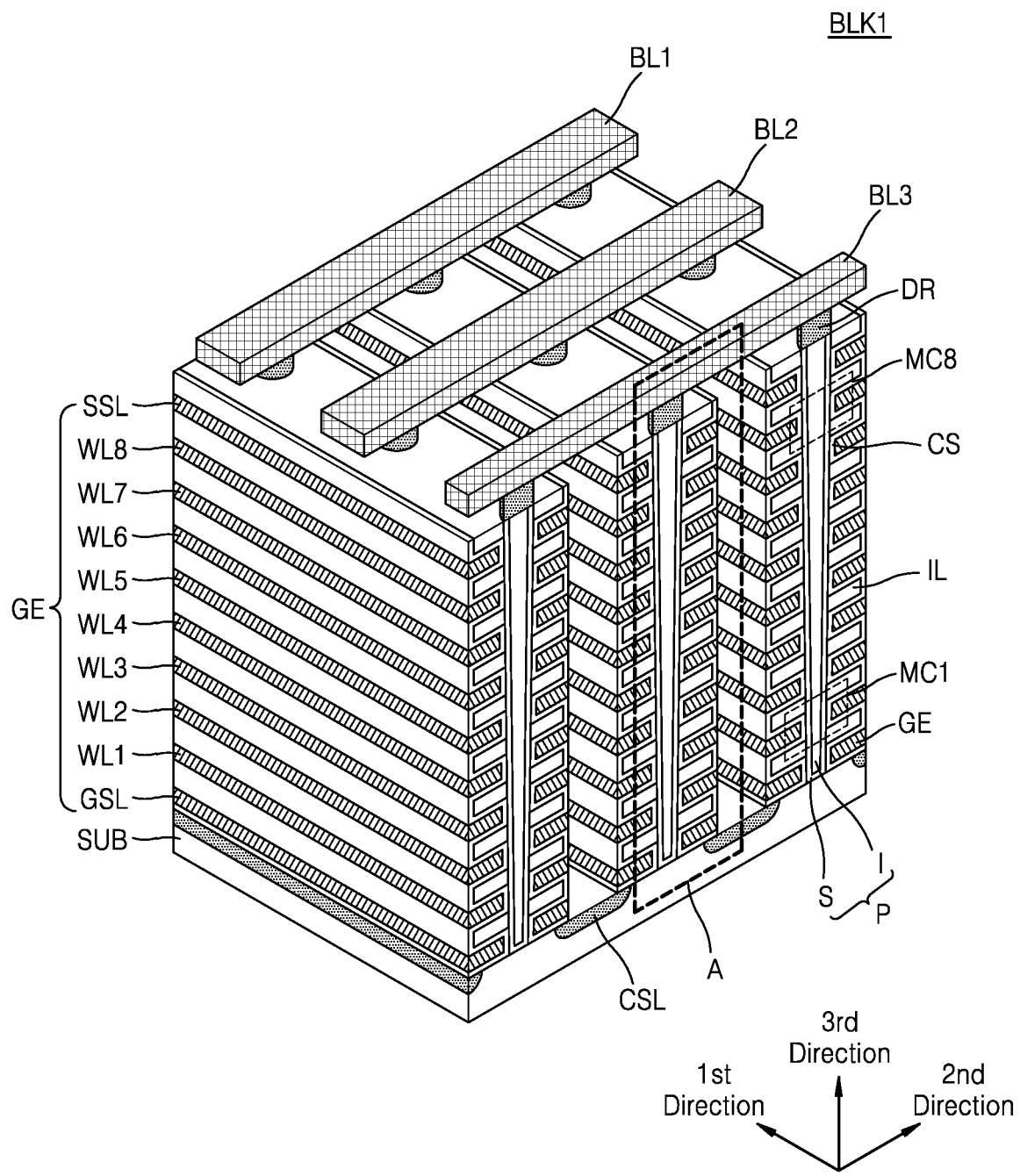
FIG. 4 illustrates a perspective view of an implementation example of a first memory block among memory blocks of FIG. 2.

FIG. 4 illustrates a perspective view of an implementation example of a first memory block among the memory blocks BLK1 to BLKz of FIG. 2.

Referring to FIG. 4, a first memory block BLK1 may be formed perpendicularly to a substrate SUB. In FIG. 4, the first memory block BLK1 includes a ground select line GSL and a string select line SSL, eight wordlines WL1 to WL8, and three bitlines BL1 to BL3. The string select line SSL that is labeled is representative of three string select lines present in the first memory block BLK1. However, in actuality, the first memory block BLK1 may include more or less than the above-described numbers of labeled elements. Also, in another example, the first memory block BLK1 may also include one or more dummy wordlines between the first wordline WL1 and the ground select line GSL and/or between the eighth wordline WL8 and the string selection line SSL. As shown in FIG. 4, one side of the cell strings is connected to the common source line CSL or more than one such common source line. The other side of the cell strings is connected to the bitlines BL1 to BL3.

The substrate SUB may be a polysilicon layer doped with a first conductivity type, for example, a p-type. The substrate SUB may be a bulk silicon substrate, a silicon on insulator (SOI) substrate, a germanium substrate, a germanium on insulator (GOI) substrate, a silicon-germanium substrate, or a substrate including an epitaxial thin layer obtained by performed selective epitaxial growth (SEG). The substrate SUB may be formed of a semiconductor material and may include at least one of silicon (Si), germanium (Ge), silicon germanium (SiGe), gallium arsenic (GaAs), indium gallium arsenic (InGaAs), aluminum gallium arsenic (AlGaAs), and a mixture thereof, for example.

A common source line CSL that extends in a first direction and is doped with impurities having a second conductivity type, for example, an n-type, may be provided to the substrate SUB. Multiple insulating layers IL that extend in the first direction may be sequentially provided to a region of the substrate SUB between two adjacent common source lines CSL in a third direction. The insulating layers IL may be spaced apart from each other by a predetermined distance in the third direction. For example, the insulating layers IL may include an insulating material, such as a silicon oxide.

A plurality of pillars P that are sequentially located in the first direction and pass through the insulating layers IL in the third direction, may be provided to the region of the substrate SUB between two adjacent common source lines CSL. For example, the pillars P may pass through the insulating layers IL and may contact the substrate SUB. In detail, a surface layer S of each pillar P may include a silicon material doped with the first conductivity type and may function as a channel region. Meanwhile, an internal layer I of each pillar P may include an insulating material or an air gap such as a silicon oxide.

A charge storage layer (CS) may be provided along an exposed surface of the insulating layers IL, the pillars P, and the substrate SUB in a region between two adjacent common source lines CSL. The charge storage layer CS may include a gate insulating layer (or 'tunneling insulating layer'), a charge trap layer, and a blocking insulating layer. For example, the charge storage layer CS may have an oxidenitride-oxide (ONO) structure. Also, a gate electrode GE, such as the select lines GSL and SSL and the wordlines WL1 to WL8, may be provided onto the exposed surface of the charge storage layer CS in the region between two adjacent common source lines CSL.

Drains or drain contacts DR may be provided to the pillars P. For example, the drains or the drain contacts DR may include a silicon material doped with impurities of the second conductivity type. The bitlines BL1 to BL3 that extend in the second direction and are spaced apart from each other by a predetermined distance in the first direction may be provided to the drains or drain contacts DR.

Figure 5:
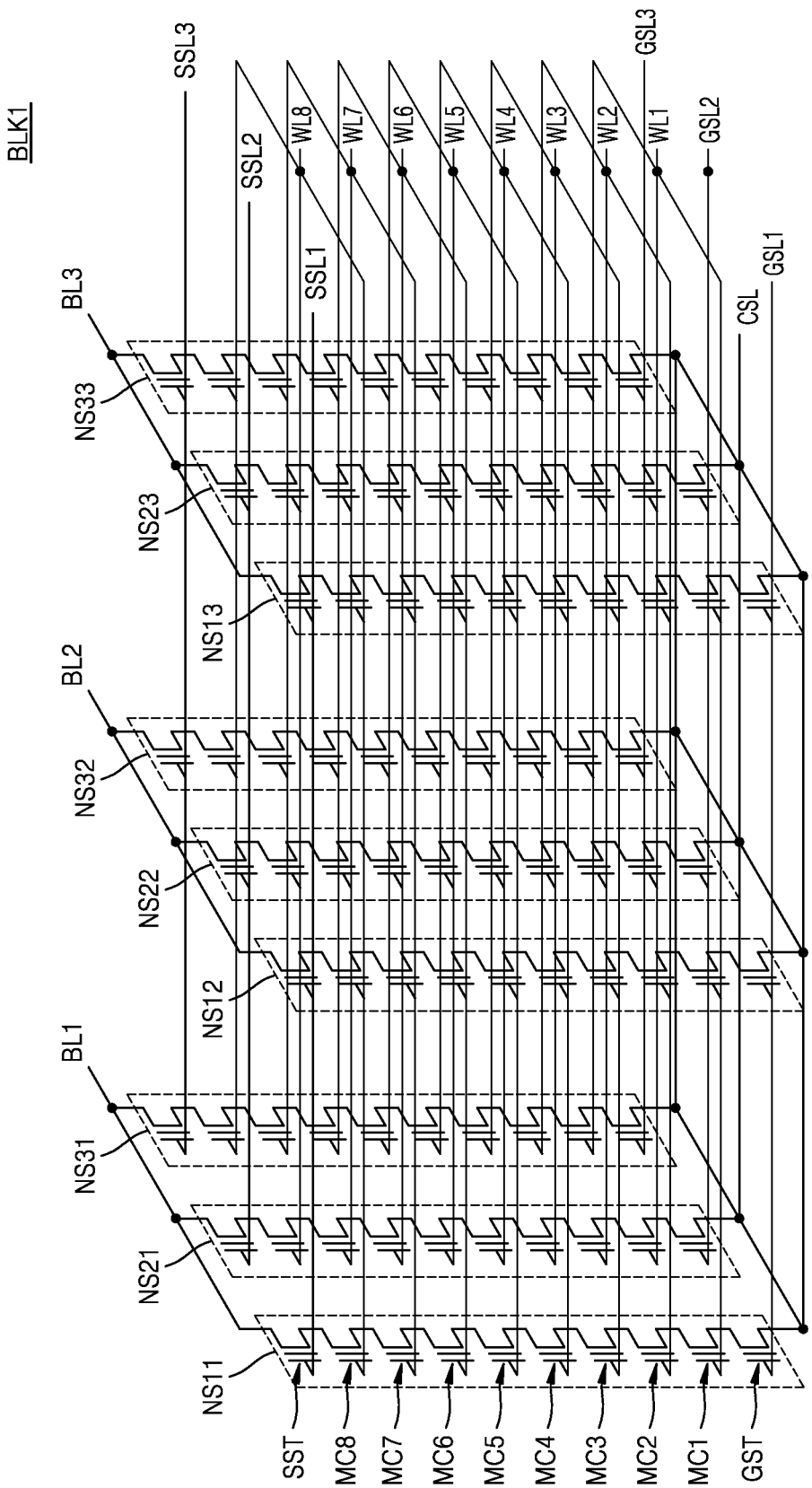
FIG. 5 illustrates a circuit diagram of an equivalent circuit of the first memory block among memory blocks of FIG. 2.

FIG. 5 illustrates a circuit diagram of an equivalent circuit of a first memory block among memory blocks of FIG. 2.

Referring to FIG. 5, a first memory block BLK1 may be an NAND flash memory having a vertical structure, and each of the memory blocks BLK1 to BLKz illustrated in FIG. 1 may be implemented as illustrated in FIG. 5. The first memory block BLK1 may include multiple NAND cell strings NS11 to NS33, multiple wordlines WL1 to WL8, multiple bitlines BL1 to BL3, multiple ground select lines GSL1 to GSL3, multiple string selection lines SSL1 to SSL3, and the common source line CSL. Here, the number of NAND cell strings, the number of wordlines, the number of bitlines, the number of ground select lines, and the number of string selection lines may be changed in various ways without departing from the scope and spirit of the teachings herein. As shown in FIG. 5, one side of the NAND cell strings is connected to the common source line CSL or more than one such common source line. The other side of the NAND cell strings is connected to the bitlines BL1 to BL3.

NAND cell strings NS11, NS21, and NS31 may be provided between the first bitline BL1 and the common source line CSL. NAND cell strings NS12, NS22, and NS32 may be provided between the second bitline BL2 and the common source line CSL. NAND cell strings NS13, NS23, and NS33 may be provided between the third bitline BL3 and the common source line CSL. Each of the NAND cell strings, for example, NS11, may include serially-connected string selection transistors SSTs, multiple memory cells MC1 to MC8, and a ground select transistor GST.

NAND cell strings commonly connected to one bitline may constitute one column. For example, the NAND cell strings NS11, NS21, and NS31 commonly connected to the first bitline BL1 may correspond to a first column. The NAND cell strings NS12, NS22, and NS32 commonly connected to the second bitline BL2 may correspond to a second column. The NAND cell strings NS13, NS23, and NS33 commonly connected to the third bitline BL3 may correspond to a third column.

NAND cell strings connected to one string selection line may constitute one row. For example, the NAND cell strings NS11, NS12, and NS13 connected to the first string selection line SSL1 may correspond to a first row. The NAND cell strings NS21, NS22, and NS23 connected to the second string selection line SSL2 may correspond to a second row. The NAND cell strings NS31, NS32, and NS33 connected to the third string selection line SSL3 may correspond to a third row.

The string selection transistor SST may be connected to corresponding string selection lines SSL1 to SSL3. The memory cells MC1 to MC8 may be connected to corresponding wordlines WL1 to WL8. The ground select transistor GST may be connected to corresponding ground select line GSL1, and the string selection transistor SST may be connected to corresponding bitline BL1. The ground select transistor GST may be connected to the common source line CSL.

In the current embodiment, wordlines having the same heights, for example, WL, are commonly connected, string selection lines SSL1 to SSL3 are separated from one another, and ground select lines GSL1 to GSL3 are separated from one another. For example, when memory cells connected to the first wordline WL1 and included in the NAND cell strings NS11, NS12, and NS13 corresponding to the first column are programmed, the first wordline WL1 and the first string selection line SSL1 are selected. However, embodiments of the present disclosure are not limited thereto. In another embodiment, the ground select lines GSL1 to GSL3 may be commonly connected.

Figure 6:
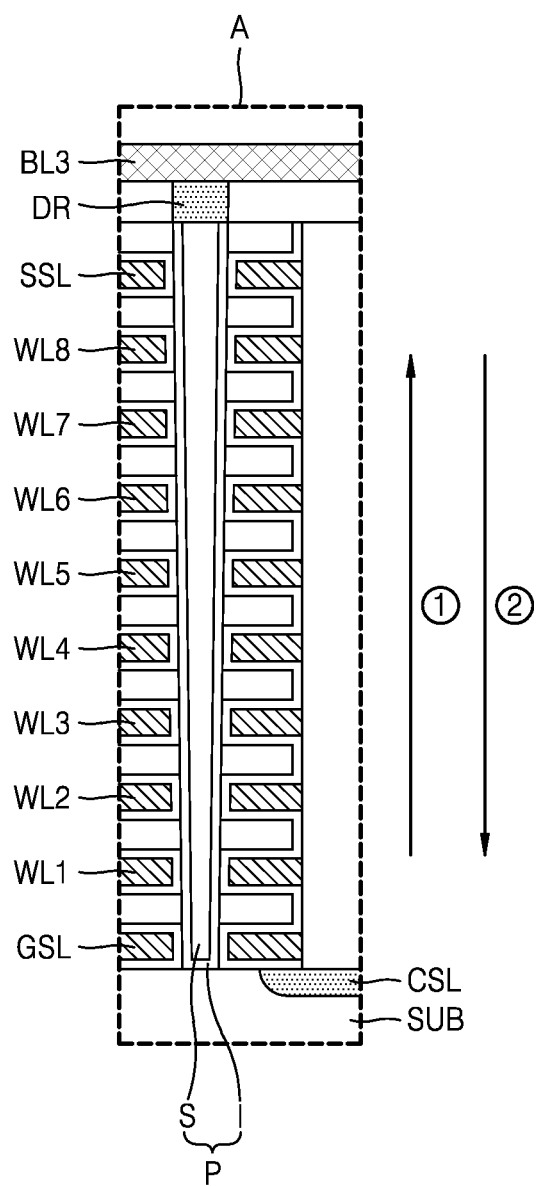
FIG. 6 illustrates a portion of a cross-section of the memory block illustrated in FIG. 4.

FIG. 6 illustrates a portion of a cross-section of the memory block illustrated in FIG. 4. FIG. 6 illustrates portion A of FIG. 4, for example.

Referring to FIG. 6, multiple program directions with respect to the cell strings connected to an arbitrary string selection line are illustrated. In an example, a program operation may be performed on the memory cells included in a cell string connected to the second string selection line SSL2 in a direction of the third bitline BL3 from the common source line CSL (①). In other words, each of the first program operation and the second program operation may be performed in the direction of the third bitline BL3 from the common source line CSL.

In another example, a program operation may be performed on the memory cells included in the cell string connected to the second string selection line SSL2 in a direction of the common source line CSL from the third bitline BL3 (②). In other words, each of the first program operation and the second program operation may be performed in the direction of the common source line CSL from the bitline BL3.

Figure 7A:
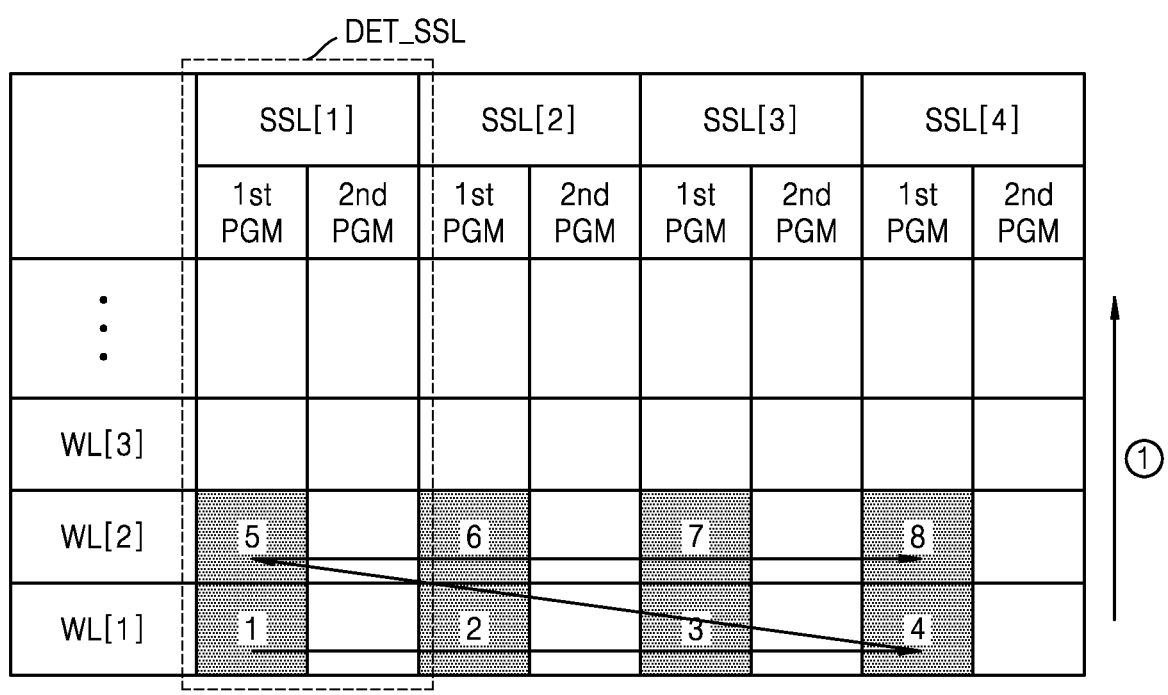
FIGS. 7A and 7B are illustrations for explaining program operations according to an example embodiment of the present disclosure.
Figure 7B:
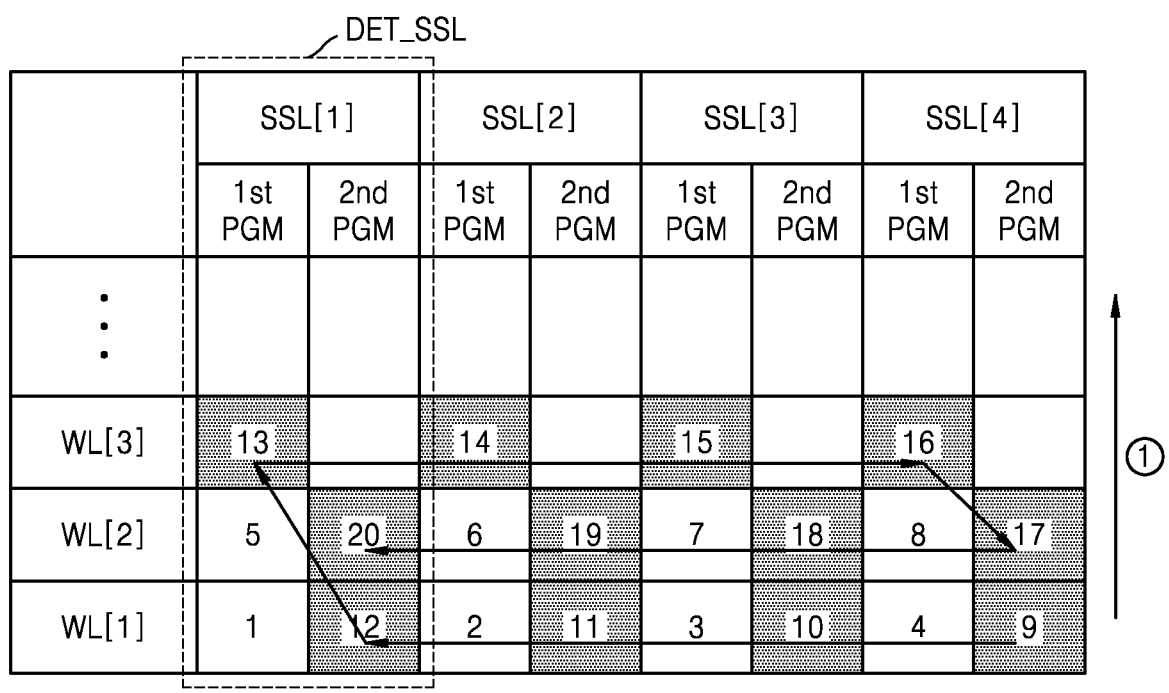

FIGS. 7A and 7B are illustrations for explaining program operations according to an example embodiment of the present disclosure. Hereinafter, in FIGS. 7A and 7B, four string selection lines are included in a program unit. However, this is just for convenience of explanation, and in actuality, the number of string selection lines included in the program unit may be more or less than four. The program unit may be a page unit or block unit, for example. Numbers marked in tables of FIGS. 7A and 7B may mean the order of program operations.

Referring to FIG. 7A, the first program operation 1st PGM may be performed in a direction ① of a bitline BL from the common source line CSL. Also, the first program operation 1st PGM may be performed in the same wordline in a direction of a fourth string selection line SSL[4] from a first string selection line SSL[1].

In an example embodiment, the first string selection line SSL[1] may be a string selection line set as a deterioration string selection line DET_SSL (i.e., a string selection line having poor deterioration endurance). For example, a deterioration string selection line DET_SSL may be statistically predicted based on various tests of the memory device 100 or a class or type of memory devices similar or identical to the memory device 100. Alternatively, the deterioration string selection line DET_SSL may also be selected as an option before mass-production of the memory device 100 is performed. Also, in an example embodiment, the fourth string selection line SSL[4] may be a string selection line set as a string selection line having excellent deterioration endurance, such as to reflect that the fourth string selection line SSL[4] has the highest deterioration endurance of two or more categories of deterioration endurance.

In detail, the first program operation 1st PGM may be performed on the memory cells included in the cell strings connected to the first string selection line SSL[1] among the memory cells connected to the first wordline WL[1]. Then, the first program operation 1st PGM may be performed on the memory cells included in the cell strings connected to each string selection line in the order from the second string selection line SSL[2] to the fourth string selection line SSL[4] among the memory cells connected to the first wordline WL[1]. Alternatively, in a modifiable embodiment, the first program operation 1st PGM may also be performed on the memory cells included in the cell strings connected to each string selection line in the order of the third string selection line SSL[3], the second string selection line SSL[2], and the fourth string selection line SSL[4] among the memory cells connected to the first wordline WL[1].

Next, the first program operation 1st PGM may be performed on the memory cells included in the cell strings connected to each string selection line in the order from the first string selection line SSL[1] to the fourth string selection line SSL[4] among the memory cells connected to the second wordline WL[2]. Alternatively, in a modifiable embodiment, the first program operation 1st PGM may also be performed on the memory cells included in the cell strings connected to each string selection line in the order of the first string selection line SSL[1], the third string selection line SSL[3], the second string selection line SSL[2], and the fourth string selection line SSL[4] among the memory cells connected to the second wordline WL[2].

In the current embodiment, consistent with the arrangement of wordlines shown in FIG. 4 and FIG. 5, the second wordline WL[2] may be located on (over, above) the first wordline WL[1]. In other words, the second wordline WL[2] may be located farther than the first wordline WL[1] from the substrate SUB in a vertical direction. That is, if the substrate SUB is primarily arranged in planes in the 1st direction and the 2nd direction in FIG. 4, the first wordline WL[1] is located in the 3rd direction over the substrate SUB and arranged in planes in the 1st direction and the 2nd direction, and the second wordline WL[2] is located in the 3rd direction over the first wordline WL[1] and arranged in planes in the 1st direction and the 2nd direction Further referring to FIG. 7A, after the first program operation 1st PGM is performed on the memory cells connected to the second wordline WL[2], the second program operation 2nd PGM may be performed on the memory cells connected to the first wordline WL[1]. In an example embodiment, the second program operation 2nd PGM may be performed on the memory cells included in string selection lines other than the first string selection line SSL[1] among the memory cells connected to the first wordline WL[1].

In an example, the second program operation 2nd PGM may be performed on the memory cells included in cell strings connected to each string selection line in the order from the fourth string selection line SSL[4] to the first string selection line SSL[1] among the memory cells connected to the first wordline WL[1]. Alternatively, in a modifiable embodiment, the second program operation 2nd PGM may also be performed on the memory cells included in the cell strings connected to each string selection line in the order of the fourth string selection line SSL[4], the second string selection line SSL[2], the third string selection line SSL[3], and the first string selection line SSL[1] among the memory cells connected to the first wordline WL[1].

Then, the first program operation 1st PGM may be performed on the memory cells included in the cell strings connected to each string selection line in the order from the first string selection line SSL[1] to the fourth string selection line SSL[4] among the memory cells connected to the third wordline WL[3]. Alternatively, in a modifiable embodiment, the first program operation 1st PGM may also be performed on the memory cells included in the cell strings connected to each string selection line in the order of the first string selection line SSL[1], the third string selection line SSL[3], the second string selection line SSL[2], and the fourth string selection line SSL[4] among the memory cells connected to the third wordline WL[3].

Then, the second program operation 2nd PGM may be performed on the memory cells connected to the second wordline WL[2]. In an example embodiment, the second program operation 2nd PGM may be performed on the memory cells included in string selection lines other than the first string selection line SSL[1] among the memory cells connected to the second wordline WL[2].

In an example, the second program operation 2nd PGM may be performed on the memory cells included in the cell strings connected to each string selection line in the order from the fourth string selection line SSL[4] to the first string selection line SSL[1] among the memory cells connected to the second wordline WL[2]. Alternatively, in a modifiable embodiment, the second program operation 2nd PGM may also be performed on the memory cells included in the cell strings connected to each string selection line in the order of the fourth string selection line SSL[4], the second string selection line SSL[2], the third string selection line SSL[3], and the first string selection line SSL[1] among the memory cells connected to the second wordline WL[2]. Although not shown, the first program operation and second program operation may be performed in the same pattern from the third wordline WL[3] to a last wordline.

Due to a program operation according to an example embodiment of the present disclosure, program intervals between memory cells connected to the same wordline may be changed according to a string selection line. In FIG. 7B, program intervals between the memory cells included in the cell strings connected to the first string selection line SSL[1] among the memory cells connected to the first wordline WL[1] may be expressed as '11(12−1)'. Also, program intervals between the memory cells included in the cell strings connected to each string selection line may be expressed '9(11−2)', '7(10−3)', and '5(9−4)', respectively, in the order from the second string selection line SSL[2] to the fourth string selection line SSL[4] among the memory cells connected to the first wordline WL[1]. That is, the program intervals are asymmetrically controlled based on a degree of deterioration of the string selection line such that the reliability of data may be further improved.

Figure 8:
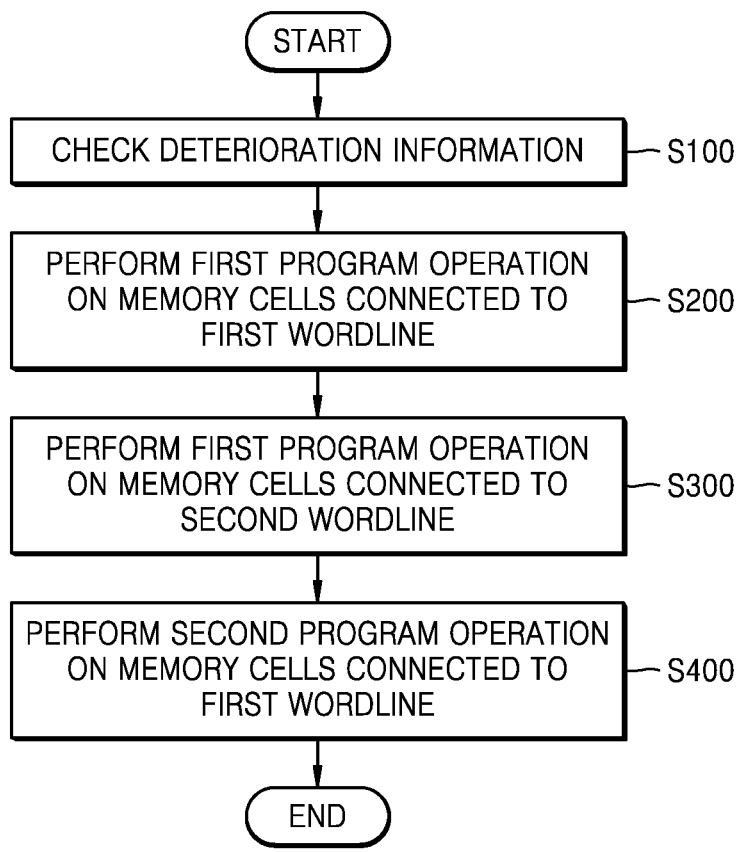
FIG. 8 is a flowchart illustrating a method of operating a memory device, according to an example embodiment of the present disclosure.

FIG. 8 is a flowchart illustrating a method of operating a memory device, according to an example embodiment of the present disclosure. The memory device may include multiple string selection lines, multiple cell strings that are connected to string selection lines and include multiple memory cells, and a memory cell array including multiple wordlines connected to the memory cells.

Referring to FIG. 8, when a data program operation with multiple steps is performed on the memory cell array, deterioration information about the string selection lines may be checked (S100). For example, the deterioration information may be stored in the memory cell array 110 as in FIG. 2 and may be provided to the control logic circuit (see control logic 130 of FIG. 2). In an example embodiment, the deterioration information may be a base for performing the data program operation.

Next, a first program operation may be performed on the memory cells connected to the first wordline (S200). By performing the first program operation, the memory cells connected to the first wordline may form a coarse distribution.

Next, the first program operation may be performed on the memory cells connected to the second wordline (S300). The second wordline may be a wordline located adjacent to the first wordline. In an example, when a direction of the program operation is a direction of a bitline in a common source line, the second wordline may be a wordline located on (over, above) the first wordline. In another example, when the direction of the program operation is a direction of the common source line in the bitline, the second wordline may be a wordline located below the first wordline.

Next, a second program operation may be performed on the memory cells connected to the first wordline (S400). In an example embodiment, a program interval in the memory cells connected to the first wordline may be changed according to a string selection line.

Figure 9:
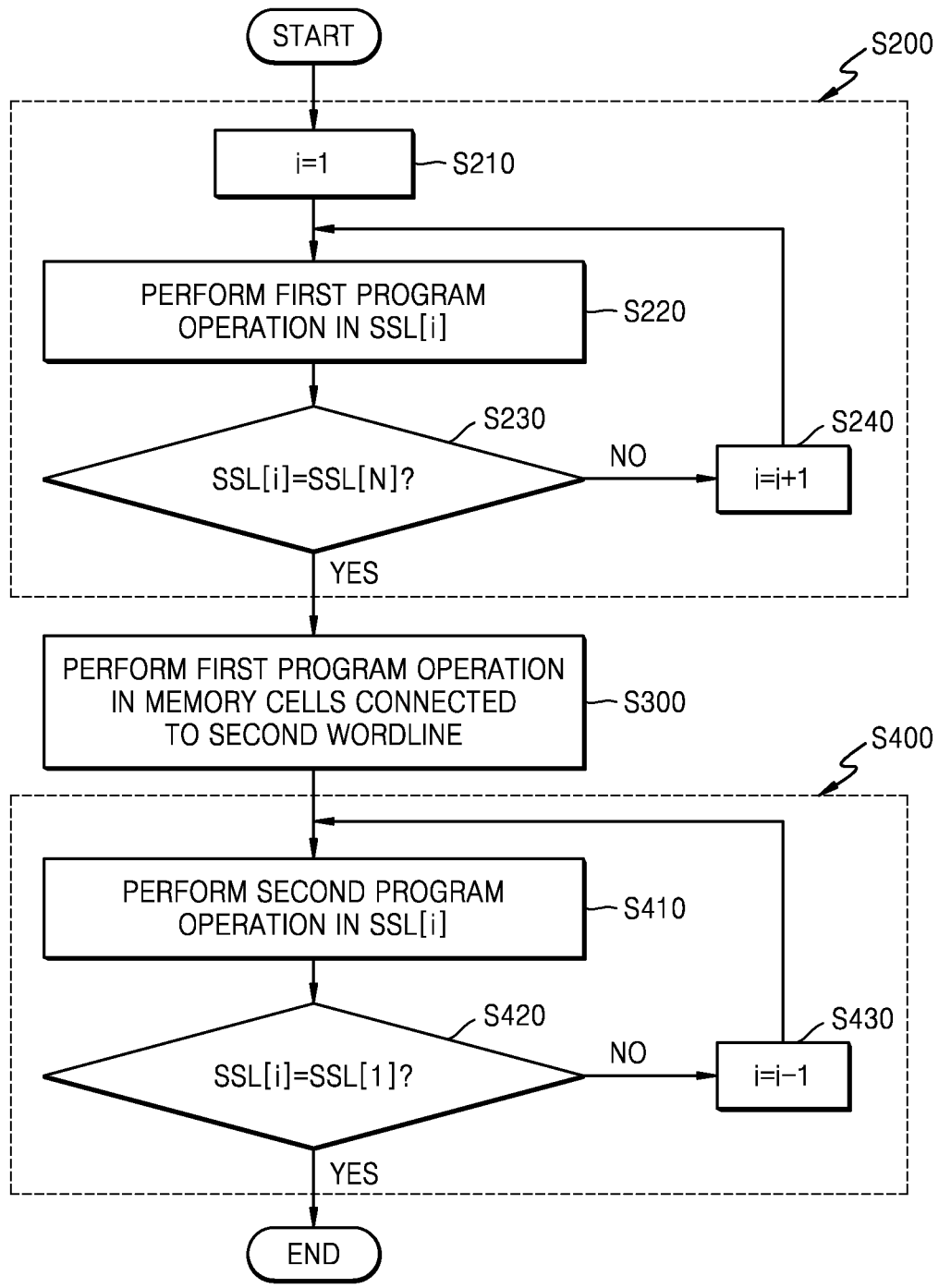
FIG. 9 is a flowchart illustrating a method of operating a memory device, according to another example embodiment of the present disclosure.

FIG. 9 is a flowchart illustrating a method of operating a memory device according to an example embodiment of the present disclosure. FIG. 9 may be a concrete example of the flowchart illustrated in FIG. 8, for example.

Referring to FIG. 9, when operation S200 is performed, a variable i may be initialized (S210). In the current embodiment, i is initialized as 1. However, this is just an example, and embodiments of the present disclosure are not limited thereto. For example, the variable i may be set according to the deterioration information.

Next, the first program operation may be performed on the memory cells included in the cell strings connected to an i-th string selection line (S220). Then, it is determined whether the i-th string selection line in which operation S220 is performed, is an N-th string selection line (S230). For example, N may be a constant that means a string selection line in which the first program operation will be lastly performed in the first wordline, and may be a predetermined value. When it is determined that the i-th string selection line is not an N-th string selection line (S230=No), 1 is added to the variable i (S240), and operation S220 may be performed again. Otherwise, when it is determined that the i-th string selection line is the N-th string selection line (S230=Yes), performing of the first program operation in the first wordline may be completed, and the first program operation may be performed on the memory cells connected to the second wordline (S300).

Next, when operation S400 is performed, a second program operation may be performed on the memory cells included in cell strings connected to the i-th string selection line (S410). Then, it is determined whether the i-th string selection line is a first string selection line (S420). When it is determined that the i-th string selection line is not the first string selection line (S420=No), 1 is subtracted from the variable i (S430), and operation S410 may be performed again. Otherwise, when it is determined that i-th string selection line is the first string selection line (S420=Yes), performing of the second program operation in the first wordline may be performed, and the process of FIG. 9 ends.

Figure 10:
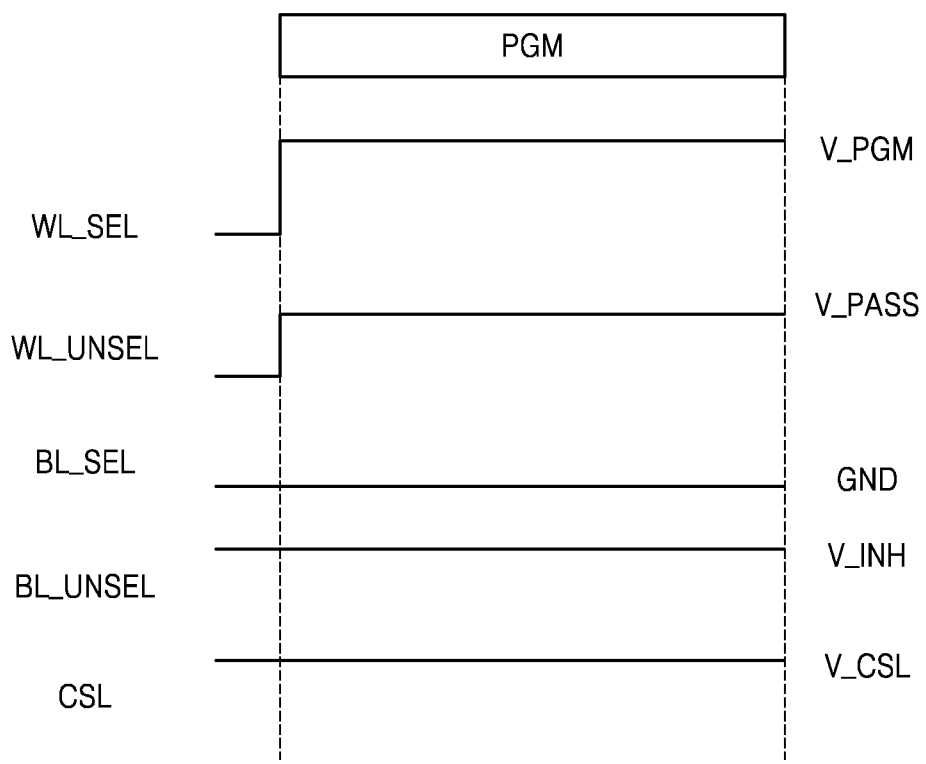
FIG. 10 is an illustration for explaining levels of voltages applied to memory cells when program operations are performed according to an example embodiment of the present disclosure.

FIG. 10 is an illustration for explaining levels of voltages applied to memory cells when program operations are performed according to an example embodiment of the present disclosure. FIG. 10 illustrates an example of levels of voltages applied to each line of the memory cell array when the first or second program operation is performed, for example.

Referring to FIG. 10, when the first or second program operation is performed, a program voltage V_PGM may be applied to a selected wordline WL_SEL, and a pass voltage V_PASS may be applied to an unselected wordline WL_UNSEL. For example, the level of the pass voltage V_PASS may be lower than the level of a program voltage V_PGM.

Also, a ground voltage GND may be applied to a selected bitline BL_SEL, and an inhibit voltage V_INH may be applied to the unselected bitline BL_UNSEL. Also, a predetermined common source line voltage V_CSL may be applied to the common source line CSL. For example, levels of the inhibit voltage V_INH and the common source line voltage V_CSL may be the same as or lower than levels of power supply voltages.

Figure 11A:
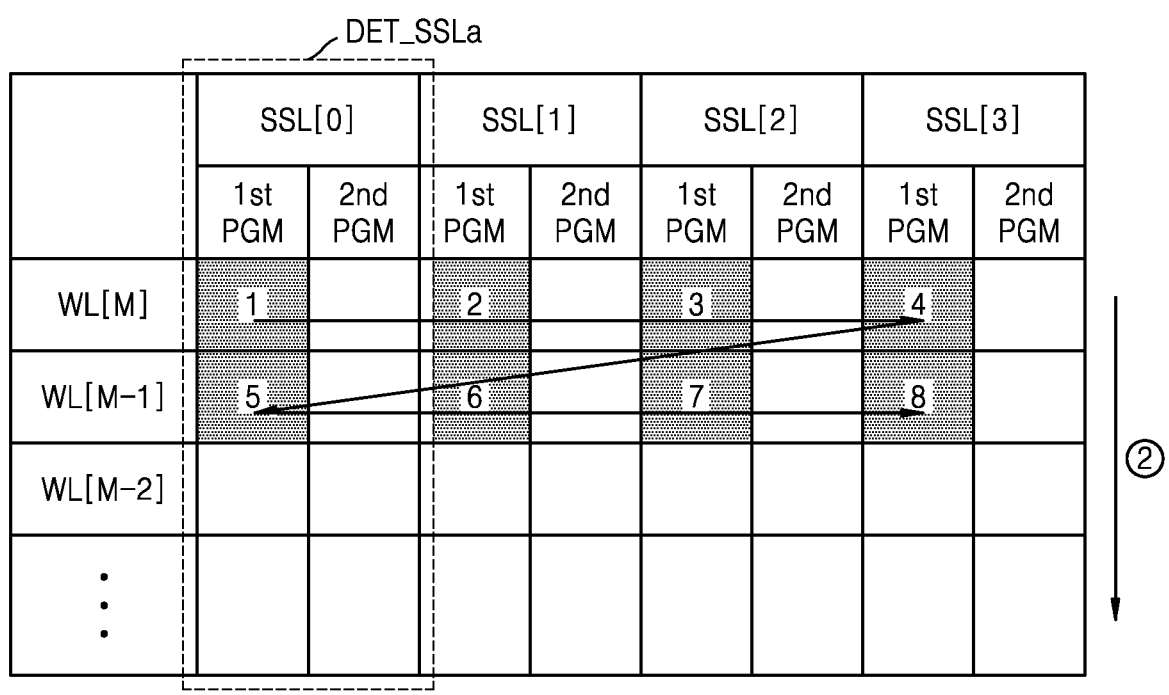

FIGS. 11A and 11B are illustrations for explaining program operations according to an example embodiment of the present disclosure. The program operations illustrated in FIGS. 11A and 11B are similar to the program operations described with reference to FIGS. 7A and 7B. However, according to the present embodiment, the first program operation 1st PGM and the second program operation 2nd PGM may be performed in a direction ② of the common source line CSL from the bitline BL. That is, after the first program operation 1st PGM is performed on the memory cells connected to an M-th wordline (where M is a natural number) WL[M], the first program operation 1st PGM may be performed on the memory ells connected to an (M−1)-th wordline WL[M−1]. Then, the second program operation 2nd PGM may be performed on the memory cells connected to the M-th wordline WL[M]. For example, M may be a natural number for indicating a topmost wordline. However, embodiments of the present disclosure are not limited thereto.

In the current embodiment, the (M−1)-th wordline WL[M−1] may be located below the M-th wordline WL[M]. In other words, the (M−1)-th wordline WL[M−1] may be located closer than the M-th wordline WL[M] to the substrate SUB in the vertical direction.

Figure 12A:
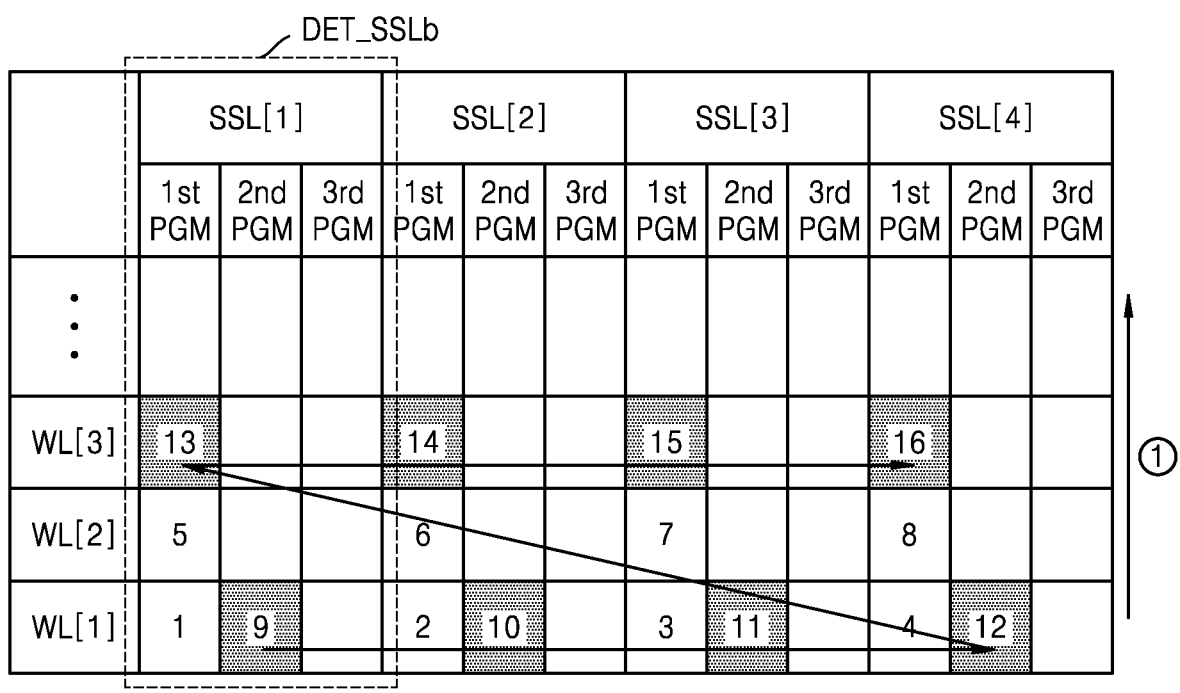

FIGS. 12A and 12B are illustrations for explaining program operations according to another example embodiment of the present disclosure. A redundant description relating to the program operations illustrated in FIGS. 12A and 12B in comparison with FIGS. 7A and 7B will be avoided.

Referring to FIG. 12A, data program operations on the memory cells may include a first program operation, second program operation, and third program operation. First, the first program operation 1st PGM may be performed on the memory cells connected to the first wordline WL[1], and the first program operation 1st PGM may be performed on the memory cells connected to the second wordline WL[2]).

Next, the second program operation 2nd PGM may be performed on the memory cells connected to the first wordline WL[1], and the first program operation 1st PGM may be performed on the memory cells connected to the third wordline WL[3]. In an example embodiment, the second program operation 2nd PGM may be performed on the memory cells included in the cell strings connected to each string selection line in the order from the first string selection line SSL[1] to the fourth string selection line SSL[4] among the memory cells connected to the first wordline WL[1].

Further referring to FIG. 12B, the second program operation 2nd PGM may be performed on the memory cells connected to the second wordline WL[2], and the third program operation 3rd PGM may be performed on the memory cells connected to the first wordline WL[1]. In an example embodiment, the third program operation 3rd PGM may be performed on the memory cells included in the cell strings connected to each string selection line in the order from the fourth string selection line SSL[4] to the first string selection line SSL[1] among the memory cells connected to the first wordline WL[1]. Alternatively, in a modifiable embodiment, the third program operation 3rd PGM may also be performed on the memory cells included in the cell strings connected to each string selection line in the order of the fourth string selection line SSL[4], the second string selection line SSL[2], the third string selection line SSL[3], and the first string selection line SSL[1] among the memory cells connected to the first wordline WL[1].

Due to the program operations according to an example embodiment of the present disclosure, an interval between the second program operation and the third program operation in the memory cells connected to the same wordline may be changed according to a string selection line. That is, even in the program operations including three or more steps, intervals between the program operations are asymmetrically controlled such that the reliability of data may be further improved.

Figure 13A:
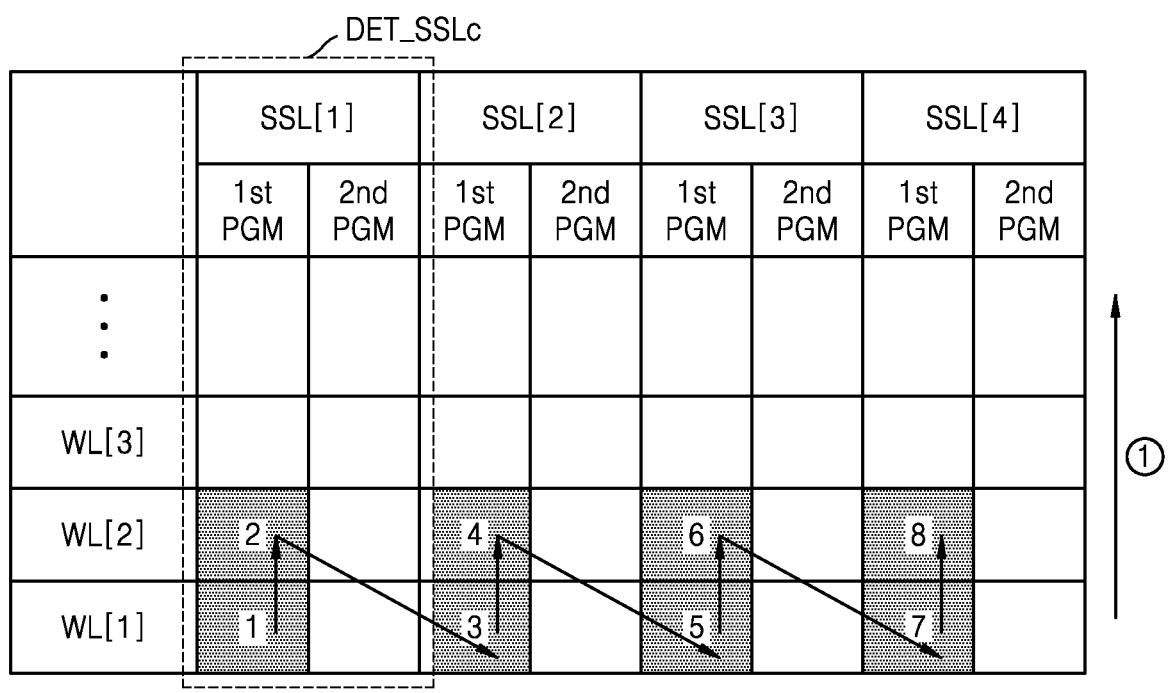

FIGS. 13A and 13B are illustrations for explaining program operations according to another example embodiment of the present disclosure. In FIGS. 13A and 13B, a redundant description relating to the program operations illustrated in FIGS. 13A and 13B in comparison with FIGS. 7A and 7B will be avoided.

Referring to FIG. 13A, the first program operation 1st PGM may be performed in a direction ① of the bitline BL from the common source line CSL within the cell string connected to the same string selection line. However, embodiments of the present disclosure are not limited thereto, and the first program operation 1st PGM may also be performed in a direction ② of the common source line CSL from the bitline BL within the cell string connected to the same string selection line. Also, the first program operation 1st PGM may be performed in a direction from the first string selection line SSL[1] to the fourth string selection line SSL[4] within the same wordline.

In an example embodiment, the first program operation 1st PGM may be alternately performed with respect to the first wordline WL[1] and the second wordline WL[2]. In detail, the first program operation 1st PGM may be performed on the memory cells connected to each wordline in the order from the first wordline WL[1] to the second wordline WL[2] among the memory cells included in the cell strings connected to the first string selection line SSL[1]. Then, the first program operation 1st PGM may be performed on the memory cells connected to each wordline in the order from the first wordline WL[1] to the second wordline WL[2] among the memory cells included in the cell strings connected to the second string selection line SSL[2]. Then, the first program operation 1st PGM may be performed on the memory cells connected to each wordline in the order from the first wordline WL[1] to the second wordline WL[2] among the memory cells included in the cell strings connected to the third string selection line SSL[3]. Then, the first program operation 1st PGM may be performed on the memory cells connected to each wordline in the order from the first wordline WL[1] to the second wordline WL[2] among the memory cells included in the cell strings connected to the fourth string selection line SSL[4].

Further referring to FIG. 13B, after performing of the first program operation 1st PGM on the memory cells connected to the first wordline WL[1] and second wordline WL[2] is completed, the second program operation 2nd PGM may be performed. In an example embodiment, the second program operation 2nd PGM may be firstly performed on the memory cells included in the cell strings connected to string selection lines other than the first string selection line SSL[1] within the same wordline.

In an example, the second program operation 2nd PGM may be performed on the memory cells included in the cell strings connected to each string selection line in the order from the fourth string selection line SSL[4] to the first string selection line SSL[1] among the memory cells connected to the first wordline WL[1]. Alternatively, in a modifiable embodiment, the second program operation 2nd PGM may also be performed on the memory cells included in the cell strings connected to each string selection line in the order of the fourth string selection line SSL[4], the second string selection line SSL[2], the third string selection line SSL[3], and the first string selection line SSL[1] among the memory cells connected to the first wordline WL[1].

In an example embodiment, the second program operation 2nd PGM with respect to the first wordline WL[1] and the first program operation 1st PGM with respect to the third wordline WL[3] may be alternately performed. For example, after the second program operation 2nd PGM is performed on the memory cells connected to the first wordline WL[1] among the memory cells included in the cell strings connected to the fourth string selection line SSL[4], the first program operation 1st PGM may be performed on the memory cells connected to the third wordline WL[3] among the memory cells included in the cell strings connected to the first string selection line SSL[1]. Then, the second program operation 2nd PGM may be performed on the memory cells connected to the first wordline WL[1] among the memory cells included in the cell strings connected to the third string selection line SSL[3], and then, the first program operation 1st PGM may be performed on the memory cells connected to the third wordline WL[3] among the memory cells included in the cell strings connected to the second string selection line SSL[2].

Figure 14:
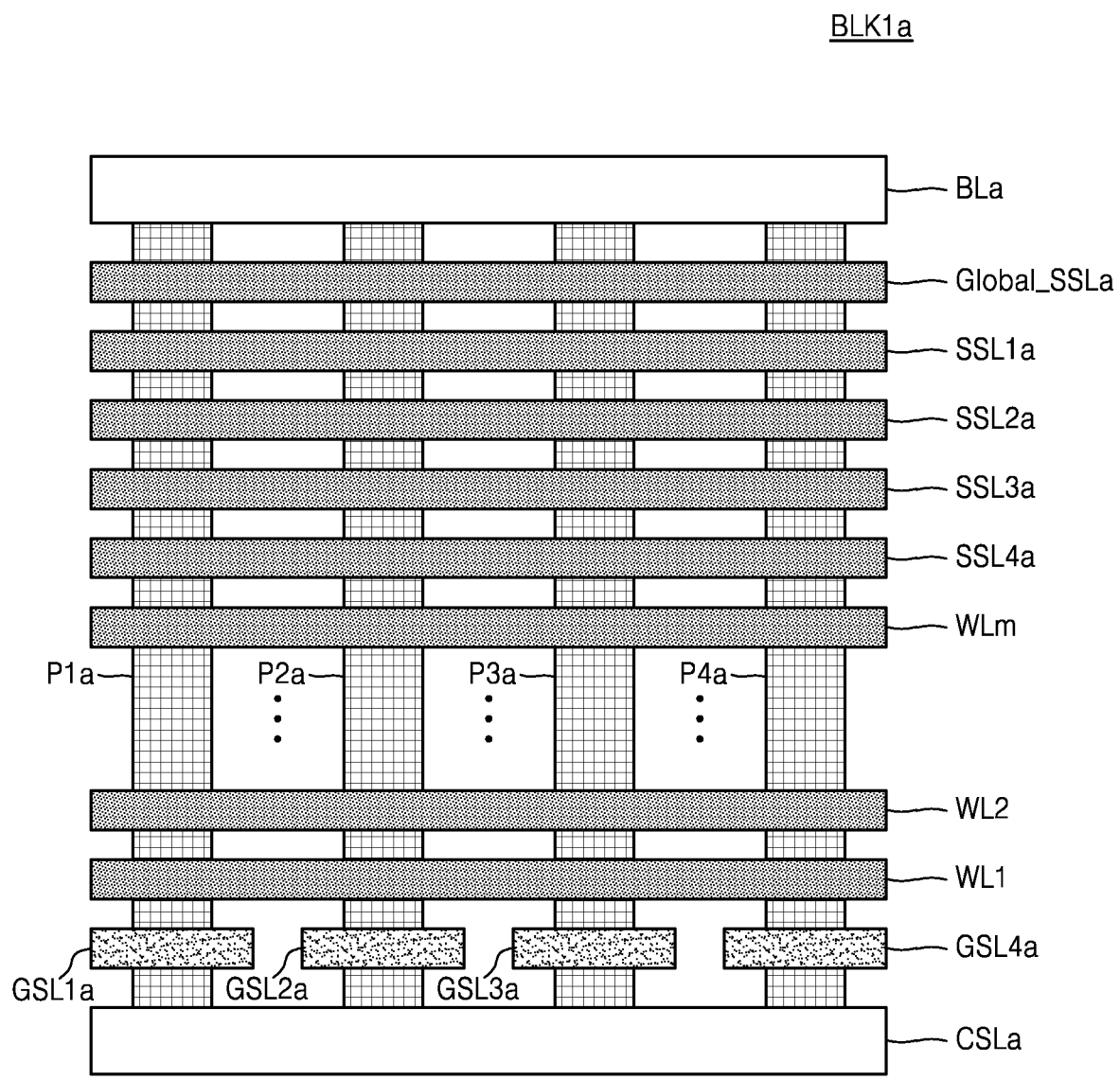
FIG. 14 illustrates a conceptual view of memory blocks according to another example embodiment of the present disclosure.

FIG. 14 is a conceptual view of memory blocks according to another example embodiment of the present disclosure. FIG. 14 may be a schematic cross-sectional view of a bitline BLa, multiple string selection lines Global_SSLa and SSL1a to SSL4a, multiple wordlines WL1 to WLm) (where m is a positive integer), multiple ground select lines GSL1a to GSL4a, and a common source line CSLa among elements of a memory block BLK1a, for example.

Referring to FIG. 14, a memory operation may be performed according to each string selection line based on voltages applied to the first string selection line SSL1a through fourth string selection line SSL4a. For example, a transistor formed through the first pillar P1a and the first string selection line SSL1a may have a threshold voltage at a first level, and a transistor formed through the first pillar P1a and the second through fourth string selection lines SSL2a to SSL4a may have a threshold voltage at a second level that is lower than the first level. Also, a transistor formed through the second pillar P2a and the second string selection line SSL2a may have a threshold voltage at the first level, and a transistor formed through the second pillar P2a and the first, third, and fourth string selection lines SSL1a, SSL3a, and SSL4a may have a threshold voltage at a second level. Also, a transistor formed through the third pillar P3a and the third string selection line SSL3a may have a threshold voltage at the first level, and a transistor formed through the third pillar P3a, and the first, second, and fourth string selection lines SSL1a, SSL2a, and SSL4a may have a threshold voltage at the second level. Also, a transistor formed through the fourth pillar P4a and the fourth string selection line SSL4a may have a threshold voltage at the first level, and a transistor formed through the fourth pillar P4a and the first string selection line SSL1a through third string selection line SSL3a may have a threshold voltage at the second level.

For example, when a selected voltage at the first level or higher is applied to the first string selection line SSL1a, a memory operation on the memory cells formed by the first pillar P1a and the wordlines WL1 to WLm may be performed. In this case, a voltage at a level that is equal to or higher than the second level or lower than the first level may be applied to the second through fourth string selection lines SSL2a to SSL4a. Thus, other pillars than the first pillar P1a may not be selected.

In other words, in the current embodiment, instead of physical separation as in FIG. 4, logical separation between the string selection lines SSL1a to SSL4a may be performed. After the string selection lines that extend in a horizontal direction are stacked on the bitline BLa and the common source line CSLa, a program operation may be performed on the transistor formed through string selection lines such that the string selection lines may be logically separated from each other.

Figure 15:
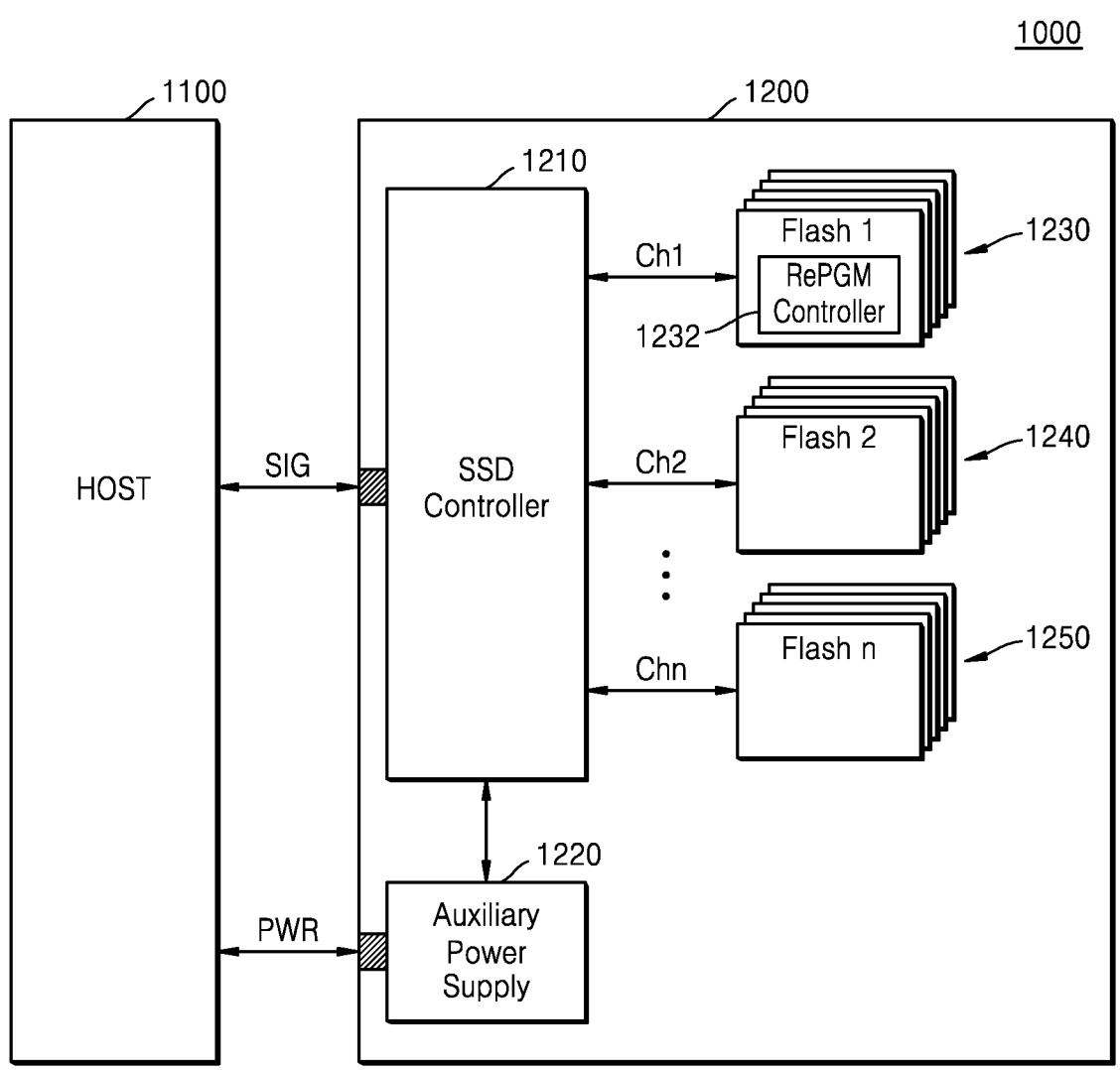
FIG. 15 illustrates a block diagram of an example in which memory devices are applied to solid-state drive (SSD) systems according to example embodiments of the present disclosure.

FIG. 15 is a block diagram of an example in which memory devices according to example embodiments of the present disclosure are applied to solid-state drive (SSD) systems.

Referring to FIG. 15, an SSD system 1000 may include a host 1100 and an SSD 1200. The SSD 1200 may transmit/receive a signal to/from the host 1100 via a signal connector and may receive power through a power connector. The SSD 1200 may include an SSD controller 1210, an auxiliary power supply 1220, and memory devices 1230, 1240, and 1250. In this case, the SSD 1200 may be implemented using the above embodiments described with reference to FIGS. 1 through 13B. Thus, each of the memory devices 1230, 1240, and 1250 may perform a data program operation including multiple steps. Each of the memory devices 1230, 1240, and 1250 may include a reprogram controller 1232. Thus, a program interval may be asymmetrically controlled based on a degree of deterioration of a string selection line. Thus, the reliability of data of the SSD system 1000 may be improved.

Figure 16:
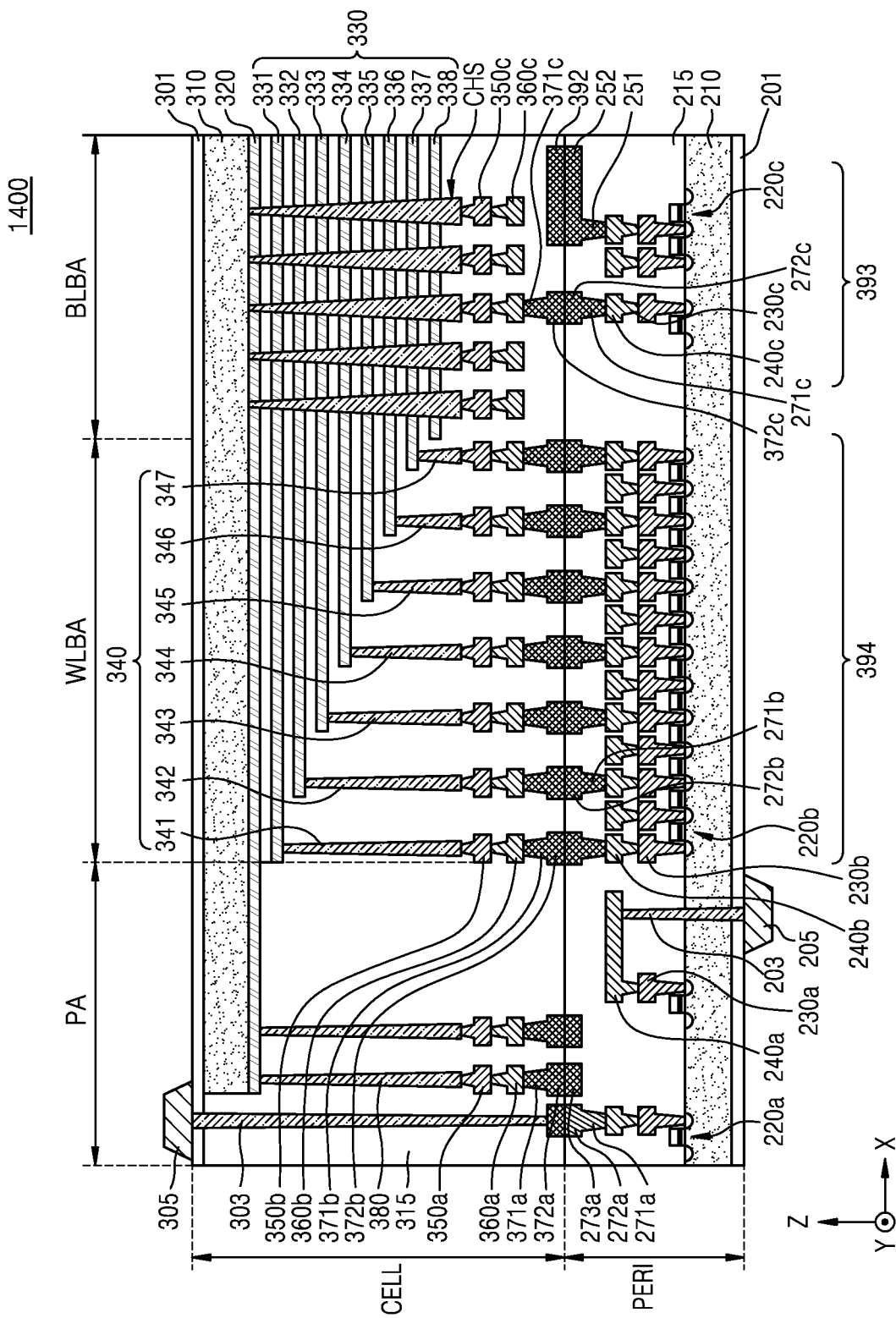
FIG. 16 illustrates a memory device having a chip-to-chip (C2C) structure, according to exemplary embodiments of the inventive concept.

FIG. 16 illustrates a memory device having a chip-to-chip (C2C) structure, according to exemplary embodiments of the inventive concept.

Referring to FIG. 16, a memory device 400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 40 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a, 230b, and 230c may be formed of tungsten having relatively high resistance, and the second metal layers 240a, 240b, and 240c may be formed of copper having relatively low resistance.

In an example embodiment illustrate in FIG. 16, although the first metal layers 230a, 230b, and 230c and the second metal layers 240a, 240b, and 240c are shown and described, they are not limited thereto, and one or more metal layers may be further formed on the second metal layers 240a, 240b, and 240c. At least a portion of the one or more metal layers formed on the second metal layers 240a, 240b, and 240c may be formed of aluminum or the like having a lower resistance than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically connected to c in a bonding manner, and the lower bonding metals 271b and 272b and the upper bonding metals 371b and 372b may be formed of aluminum, copper, tungsten, or the like. Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction(a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction, perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (a Y-axis direction), parallel to the upper surface of the second substrate 310.

In an example embodiment illustrated in FIG. 16, an area in which the channel structure CH, the bit line 360c, and the like are disposed may be defined as the bit line bonding area BLBA. In the bit line bonding area BLBA, the bit line 360c may be electrically connected to the circuit elements 220c providing a page buffer 393 in the peripheral circuit region PERI. For example, the bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a second direction (an X-axis direction), parallel to the upper surface of the second substrate 310, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b providing a row decoder 394 in the peripheral circuit region PERI. In an example embodiment, operating voltages of the circuit elements 220b providing the row decoder 394 may be different than operating voltages of the circuit elements 220c providing the page buffer 393. For example, operating voltages of the circuit elements 220c providing the page buffer 393 may be greater than operating voltages of the circuit elements 220b providing the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 205 and 305 may be disposed in the external pad bonding area PA. Referring to FIG. 16, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 16, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 220a, 220b, and 220c disposed in the peripheral circuit region PERI through a second input-output contact plug 303.

According to embodiments, the second substrate 310 and the common source line 320 may not be disposed in an area in which the second input-output contact plug 303 is disposed. Also, the second input-output pad 305 may not overlap the word lines 330 in the third direction (the Z-axis direction). Referring to FIG. 16, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to embodiments, the first input-output pad 205 and the second input-output pad 305 may be selectively formed. For example, the memory device 400 may include only the first input-output pad 205 disposed on the first substrate 210 or the second input-output pad 305 disposed on the second substrate 310. Alternatively, the memory device 400 may include both the first input-output pad 205 and the second input-output pad 305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 400 may include a lower metal pattern 273a, corresponding to an upper metal pattern 372a formed in an uppermost metal layer of the cell region CELL, and having the same shape as the upper metal pattern 372a of the cell region CELL, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu—Cu bonding.

Further, the bit line bonding area BLBA, an upper metal pattern 392, corresponding to a lower metal pattern 252 formed in the uppermost metal layer of the peripheral circuit region PERI, and having the same shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

While the present disclosure has been particularly shown and described with reference to embodiments thereof, it will be understood that various changes in form and details may be made therein without departing from the spirit and scope of the following claims.

What is claimed is:

1. A memory device, comprising:
a memory cell region including a first metal pad;
a peripheral circuit region including a second metal pad and vertically connected to the memory cell region by the first metal pad and the second metal pad;
a memory cell array in the memory cell region comprising a plurality of string selection lines, a plurality of cell strings respectively connected to the plurality of string selection lines and including a plurality of memory cells, and a plurality of wordlines connected to the plurality of memory cells;
a control logic circuit in the peripheral circuit region configured to control a plurality of data program steps with respect to the plurality of memory cells; and
a row decoder in the peripheral circuit region configured to activate the plurality of string selection lines based on control of the control logic circuit,
wherein the plurality of data program steps include a first program operation and a second program operation between which a program interval is formed,
the control logic circuit includes a reprogram controller configured to control the row decoder so that the program interval differs in memory cells connected to different string selection lines of the plurality of string selection lines among the memory cells connected to a first wordline, and
wherein the first program operation is configured to program data and the second program operation is configured to reprogram the data, and the second program operation on the memory cells connected to the first wordline is performed after the first program operation on the memory cells connected to a second wordline from the plurality of wordlines.

2. The memory device of claim 1, wherein the plurality of string selection lines include a first string selection line, a second string selection line and a third string selection line, and the control logic circuit controls the row decoder so that the program interval in the memory cells included in the cell strings connected to the first string selection line among the memory cells connected to the first wordline is longer than the program interval in the memory cells included in the cell strings connected to the second string selection line and the third string selection line among the memory cells connected to the first wordline.

3. The memory device of claim 1, wherein the control logic circuit controls the row decoder to perform the first program operation firstly on the memory cells included in the cell strings connected to a first string selection line of the plurality of string selection lines among the memory cells connected to the first wordline and controls the row decoder to perform the second program operation lastly on the memory cells included in the cell strings connected to the first string selection line among the memory cells connected to the first wordline.

4. The memory device of claim 1, wherein the control logic circuit controls the row decoder to perform the first program operation lastly on the memory cells included in the cell strings connected to a second string selection line of the plurality of string selection lines among the memory cells connected to the first wordline and controls the row decoder to perform the second program operation firstly on the memory cells included in the cell strings connected to the second string selection line among the memory cells connected to the first wordline.

5. The memory device of claim 1, wherein the first metal pad and the second metal pad are formed of copper.

6. The memory device of claim 1, wherein the first metal pad and the second metal pad are connected by a bonding manner.

7. The memory device of claim 1, wherein the memory cell region is formed on a first wafer and the peripheral circuit region is formed on a second wafer.

8. The memory device of claim 1, wherein the control logic circuit is configured to control the program interval between the first program operation and the second program operation to differ in the memory cells connected to different string selection lines of the plurality of string selection lines based on deterioration information of the plurality of string selection lines.

9. The memory device of claim 8, wherein the deterioration information comprises predictive information specific to each of the plurality of string selection lines.

10. A method of operating a memory device including a memory cell array, the memory device comprising a memory cell region including a first metal pad and a peripheral circuit region including a second metal pad and vertically connected to the memory cell region by the first metal pad and the second metal pad,
the memory cell array in the memory cell region including a plurality of string selection lines, a plurality of cell strings respectively connected to the plurality of string selection lines and including a plurality of memory cells, and a plurality of wordlines connected to the plurality of memory cells, the method comprising:
performing a first program operation on the memory cells connected to a first wordline among the plurality of wordlines;
performing the first program operation on the memory cells connected to a second wordline among the plurality of wordlines; and
performing a second program operation on the memory cells connected to the first wordline,
wherein a first interval between the first program operation and the second program operation differs in the memory cells included in the cell strings connected to different string selection lines of the plurality of string selection lines among the memory cells connected to the first wordline, and
wherein the first program operation is configured to program data and the second program operation is configured to reprogram the data, and the second program operation on the memory cells connected to the first wordline is performed after the first program operation on the memory cells connected to the second wordline.

11. The method of claim 10, wherein a first string selection line of the plurality of string selection lines is a string selection line set as a string selection line having a lowest deterioration endurance among the plurality of string selection lines, and the first interval in memory cells included in the cell strings connected to the first string selection line is longer than the first interval for memory cells included in the cell strings connected to string selection lines of the plurality of string selection lines other than the first string selection line.

12. The method of claim 10, wherein the performing of the first program operation on the memory cells connected to the first wordline comprises:
  performing the first program operation on the memory cells included in the cell strings connected to a first string selection line of the plurality of string selection lines among the memory cells connected to the first wordline; and
  performing the first program operation on the memory cells included in the cell strings connected to string selection lines of the plurality of string selection lines other than the first string selection line among the memory cells connected to the first wordline.

13. The method of claim 12, wherein the performing of the second program operation on the memory cells connected to the first wordline comprises:
  performing the second program operation on the memory cells included in the cell strings connected to the string selection lines other than the first string selection line among the memory cells connected to the first wordline; and
  performing the second program operation on the memory cells included in the cell strings connected to the first string selection line among the memory cells connected to the first wordline.

14. The method of claim 10, wherein the first interval between the first program operation and the second program operation in the memory cells included in the cell strings connected to a first string selection line of the plurality of string selection lines among the memory cells connected to the first wordline differs from the first interval between the first program operation and the second program operation in the memory cells included in the cell strings connected to a second string selection line of the plurality of string selection lines among the memory cells connected to the first wordline.

15. The method of claim 10, wherein the first wordline and the second wordline are located adjacent to each other.

16. The method of claim 10, wherein the first metal pad and the second metal pad are formed of copper.

17. The method of claim 10, wherein the first metal pad and the second metal pad are connected by a bonding manner.

18. The method of claim 10, wherein the memory cell region is formed on a first wafer and the peripheral circuit region is formed on a second wafer.

19. The method of claim 10, wherein the first interval between the first program operation and the second program operation is controlled to differ in the memory cells connected to different string selection lines of the plurality of string selection lines based on deterioration information of the plurality of string selection lines.

20. The method of claim 19, wherein the deterioration information comprises predictive information specific to each of the plurality of string selection lines.

* * * * *